US012125535B2

(12) United States Patent
Kim et al.

(10) Patent No.: US 12,125,535 B2
(45) Date of Patent: Oct. 22, 2024

(54) INTEGRATED CIRCUIT DEVICE INCLUDING VERTICAL MEMORY

(71) Applicant: SAMSUNG ELECTRONICS CO., LTD., Suwon-si (KR)

(72) Inventors: Kwanyong Kim, Suwon-si (KR); Sunil Shim, Suwon-si (KR); Wonseok Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 300 days.

(21) Appl. No.: 17/698,627

(22) Filed: Mar. 18, 2022

(65) Prior Publication Data

US 2022/0208269 A1 Jun. 30, 2022

Related U.S. Application Data

(63) Continuation of application No. 16/781,986, filed on Feb. 4, 2020, now Pat. No. 11,295,815.

(30) Foreign Application Priority Data

Jun. 11, 2019 (KR) ........................ 10-2019-0068802

(51) Int. Cl.
*G11C 16/08* (2006.01)
*G11C 16/04* (2006.01)

(52) U.S. Cl.
CPC .......... *G11C 16/08* (2013.01); *G11C 16/0466* (2013.01); *G11C 16/0483* (2013.01)

(58) Field of Classification Search
CPC ...................................................... G11C 16/08
USPC .......................................................... 365/110
See application file for complete search history.

(56) References Cited

U.S. PATENT DOCUMENTS 8,953,376 B2 2/2015 Nam et al.
9,391,090 B2 7/2016 Manorotkul et al.
9,576,973 B2 2/2017 Lee et al.
9,691,782 B1 6/2017 Hwang et al.
2011/0309431 A1* 12/2011 Kidoh ............... H01L 27/11575 257/324
2012/0007165 A1* 1/2012 Lee ................... H01L 29/40114 257/316

(Continued)

FOREIGN PATENT DOCUMENTS

KR 10-2012-0053329 5/2012

OTHER PUBLICATIONS

Office Action in Korean Appln. No. 10-2019-0068802, mailed on Dec. 6, 2023, 10 pages (with English translation).

*Primary Examiner* — Muna A Techane
(74) *Attorney, Agent, or Firm* — Fish & Richardson P.C.

(57) ABSTRACT

An integrated circuit device includes a plurality of word lines, a string selection line structure stacked on the plurality of word lines, and a plurality of channel structures extending in a vertical direction through the plurality of word lines and the string selection line structure. The string selection line structure includes a string selection bent line including a lower horizontal extension portion extending in a horizontal direction at a first level higher than the plurality of word lines, an upper horizontal extension portion extending in the horizontal direction at a second level higher than the first level, and a vertical extension portion connected between the lower horizontal extension portion and the upper horizontal extension portion.

18 Claims, 40 Drawing Sheets

A - A'

(56) References Cited

U.S. PATENT DOCUMENTS

| | | | | |
|---|---|---|---|---|
| 2013/0100742 | A1* | 4/2013 | Lee | G11C 16/0483 365/185.18 |
| 2013/0146980 | A1* | 6/2013 | Tanzawa | G11C 16/08 257/368 |
| 2015/0129903 | A1* | 5/2015 | Yamamoto | G09G 3/3233 257/88 |
| 2018/0240808 | A1 | 8/2018 | Song et al. | |
| 2018/0358375 | A1 | 12/2018 | Ku et al. | |
| 2019/0206495 | A1* | 7/2019 | Ito | G11C 5/14 |
| 2022/0208269 | A1 | 6/2022 | Kim et al. | |

* cited by examiner

INTEGRATED CIRCUIT DEVICE INCLUDING VERTICAL MEMORY

CROSS-REFERENCE TO RELATED APPLICATION

This is a Continuation of U.S. application Ser. No. 16/781,986, filed Feb. 4, 2020, which issued as U.S. Pat. No. 11,295,815, on Apr. 5, 2022, and a claim of priority is made to Korean Patent Application No. 10-2019-0068802, filed on Jun. 11, 2019, in the Korean Intellectual Property Office, the disclosures of which are incorporated herein in their entireties by reference.

BACKGROUND

The inventive concept relates to integrated circuit devices, and more particularly, to integrated circuit devices including vertical memories.

As information communication apparatuses become multifunctional, the demand for higher memory capacities and higher degrees of integration increases. Also, as memory cell sizes are reduced as a result, the operations and electrical connections of memory circuits and line structures are becoming increasingly complex.

SUMMARY

According to an aspect of the inventive concept, there is provided an integrated circuit device which include a substrate including a main surface, a plurality of word lines extending over the substrate in a horizontal direction parallel to the main surface of the substrate and overlapping each other in a vertical direction, a string selection line structure stacked on the plurality of word lines, and a plurality of channel structures extending in the vertical direction through the plurality of word lines and the string selection line structure. The string selection line structure includes a string selection bent line including a lower horizontal extension portion extending in the horizontal direction at a first level higher than the plurality of word lines, an upper horizontal extension portion extending in the horizontal direction at a second level higher than the first level, and a vertical extension portion connected between the lower horizontal extension portion and the upper horizontal extension portion.

According to another aspect of the inventive concept, there is provided an integrated circuit device which includes a substrate including a main surface, and a pair of word line cut regions extending lengthwise in a first horizontal direction over the substrate and spaced apart from each other in a second horizontal direction perpendicular to the first horizontal direction with a unit block region therebetween, where the first and second horizontal directions extend parallel to the main surface of the substrate. The integrated circuit device further includes a plurality of word lines extending in the unit block region in a third horizontal direction parallel to the main surface of the substrate and overlapping each other in a vertical direction, a string selection line structure stacked on the plurality of word lines in the unit block region, and a plurality of channel structures extending in the vertical direction through the plurality of word lines and the string selection line structure in the unit block region. The string selection line structure includes a string selection bent line including a lower horizontal extension portion extending in the horizontal direction at a first level higher than the plurality of word lines, an upper horizontal extension portion extending in the horizontal direction at a second level higher than the first level, and a vertical extension portion connected between the lower horizontal extension portion and the upper horizontal extension portion.

According to another aspect of the inventive concept, there is provided an integrated circuit device which includes a substrate, a plurality of word line cut regions arranged over the substrate, and a plurality of unit block regions respectively arranged one by one between the plurality of word line cut regions and each including a string selection line structure. In each of the plurality of unit block regions, the string selection line structure includes a string selection bent line including a lower horizontal extension portion extending in a horizontal direction at a first level over the substrate, an upper horizontal extension portion extending in the horizontal direction at a second level higher than the first level, and a vertical extension portion connected between the lower horizontal extension portion and the upper horizontal extension portion.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
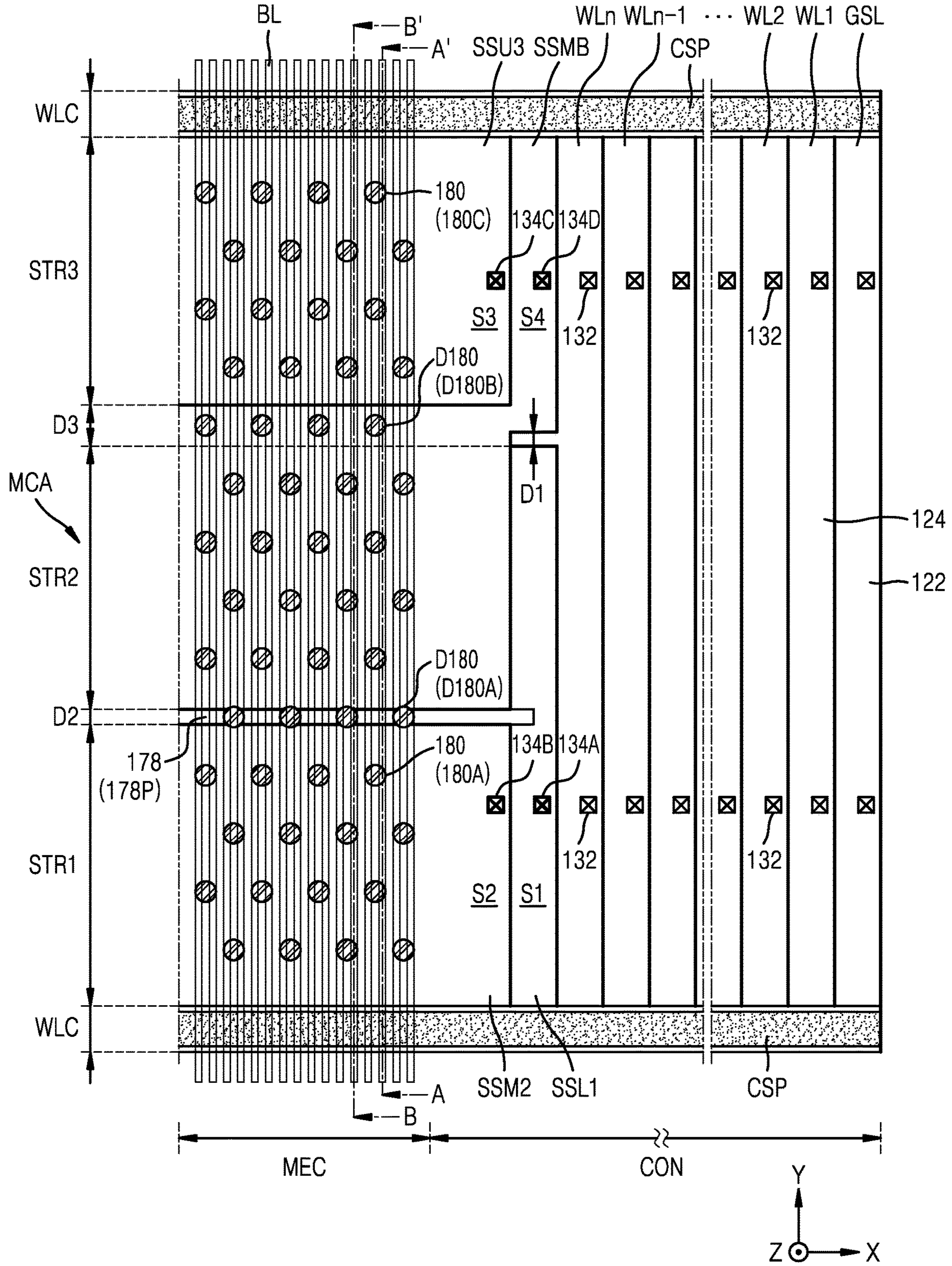
FIG. 1 is a plan view illustrating some components of an integrated circuit device according to embodiments of the inventive concept.

Hereinafter, embodiments of the inventive concept will be described in detail with reference to the accompanying drawings. Herein, like reference numerals will denote like elements, and redundant descriptions thereof will be omitted for conciseness. Throughout the description, relative locations of components are described using terms such as "vertical", "horizontal", "over", "higher" and so on. These terms are for descriptive purposes only, and are intended only to describe the relative locations of components assuming the orientation of the overall device is the same as that shown in the drawings. The embodiments, however, are not limited to the illustrated device orientations.

Figure 2A:
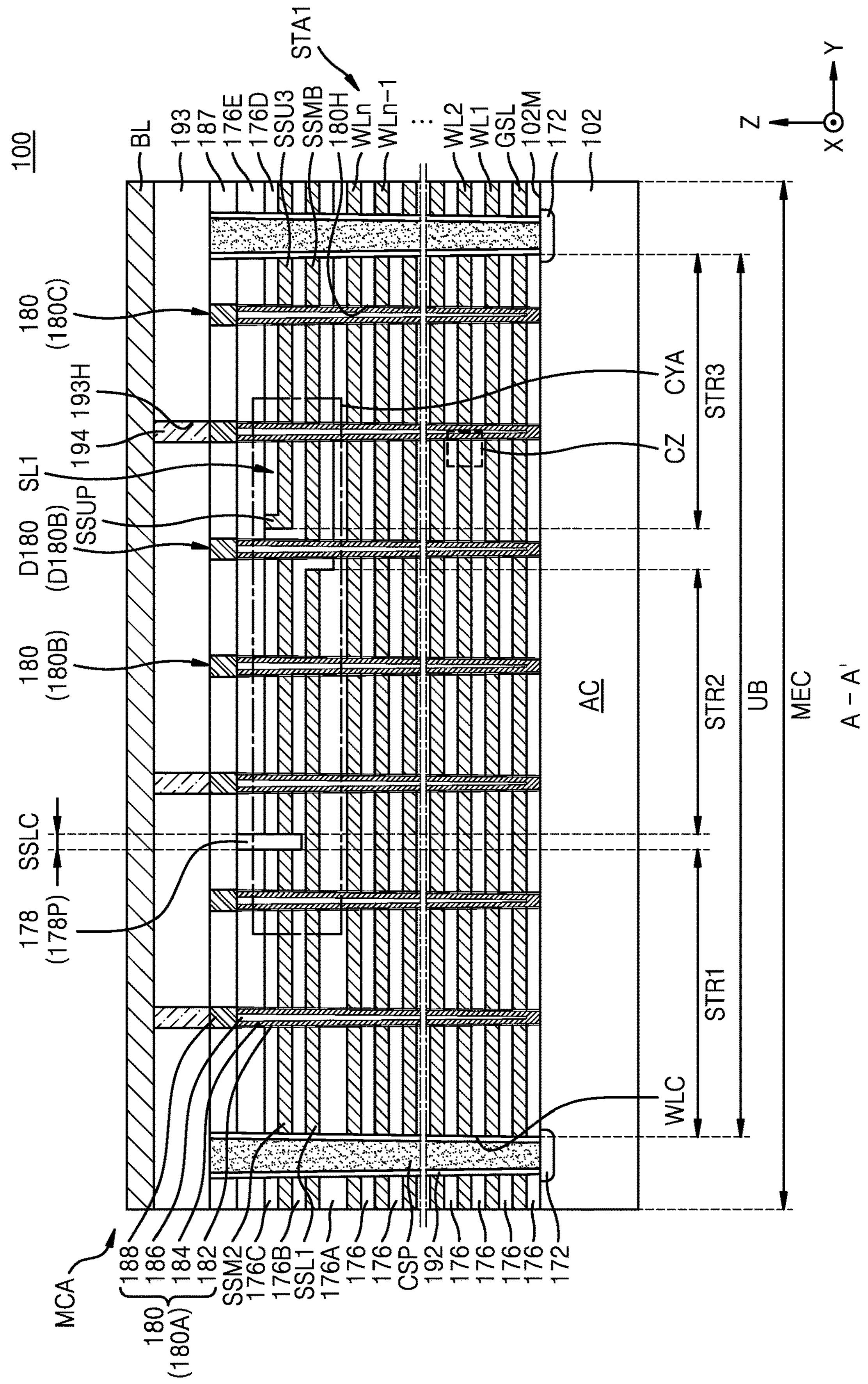
FIG. 2A is a cross-sectional view taken along line A-A' of FIG. 1.
Figure 2B:
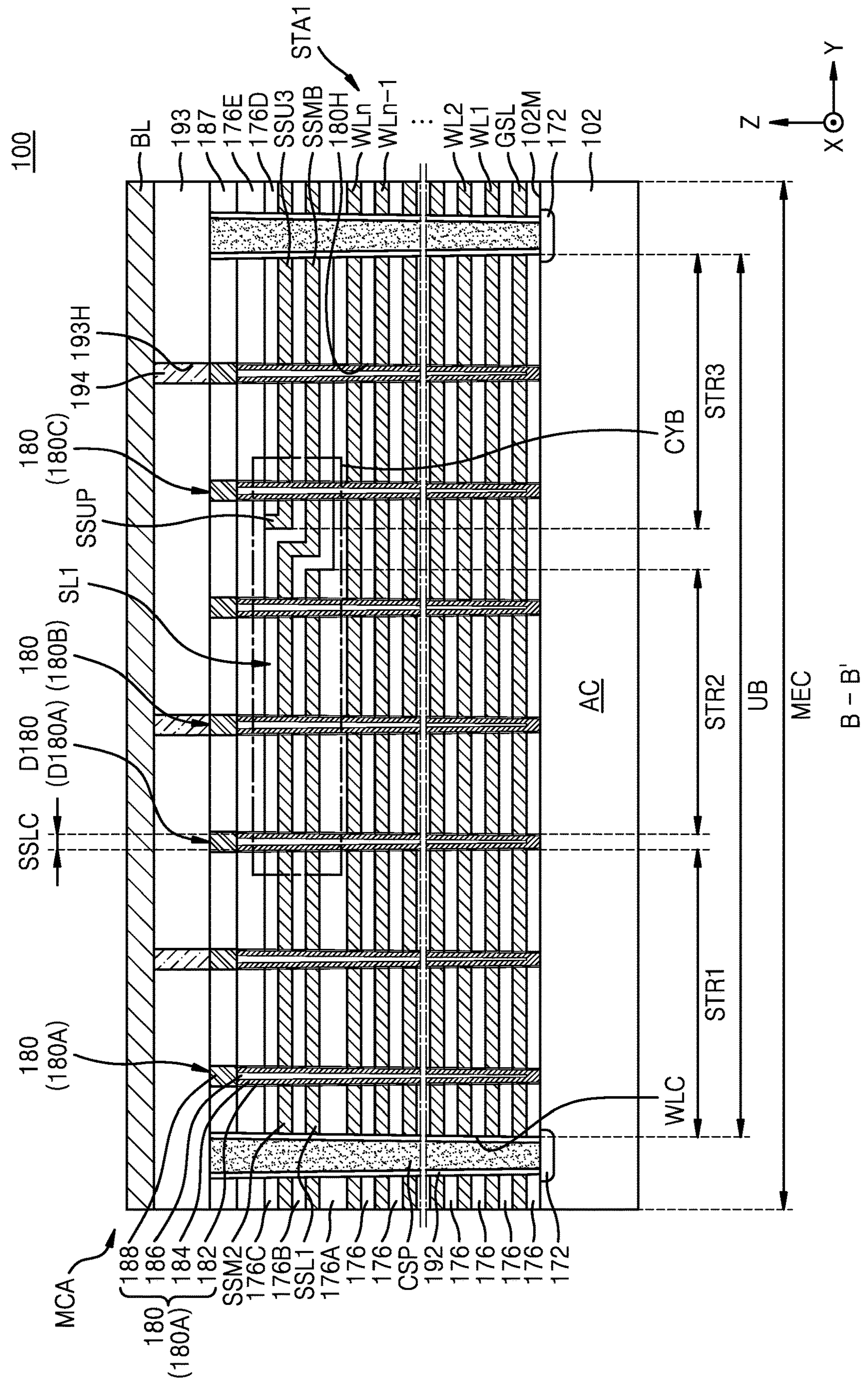
FIG. 2B is a cross-sectional view taken along line B-B' of FIG. 1.
Figure 2C:
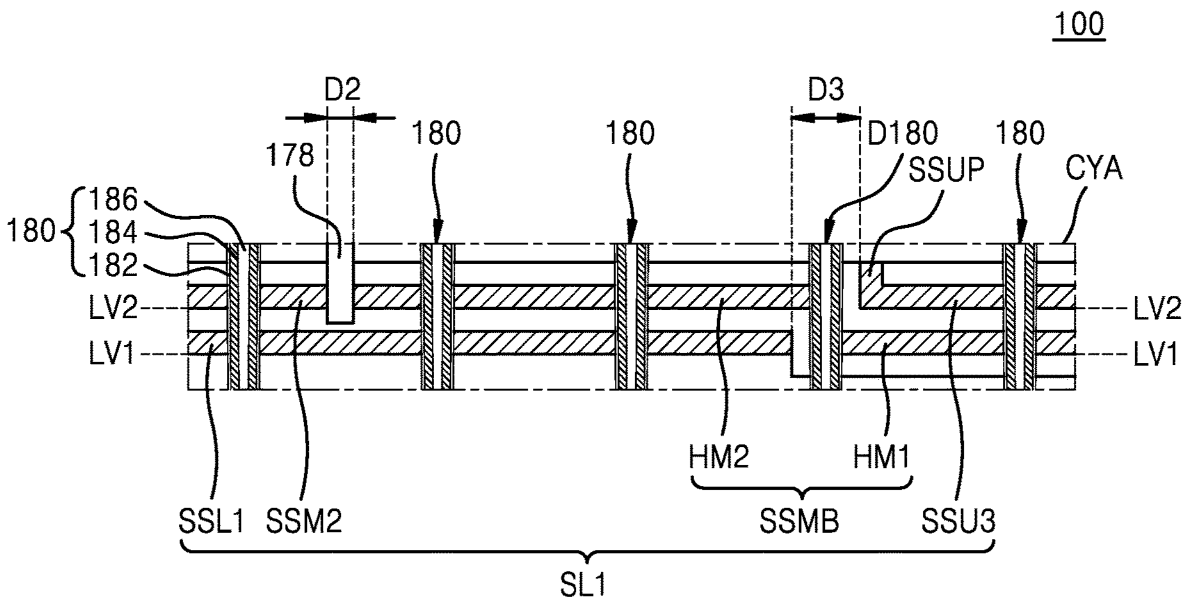
FIG. 2C is an enlarged cross-sectional view of a region CYA in FIG. 2A.
Figure 2D:
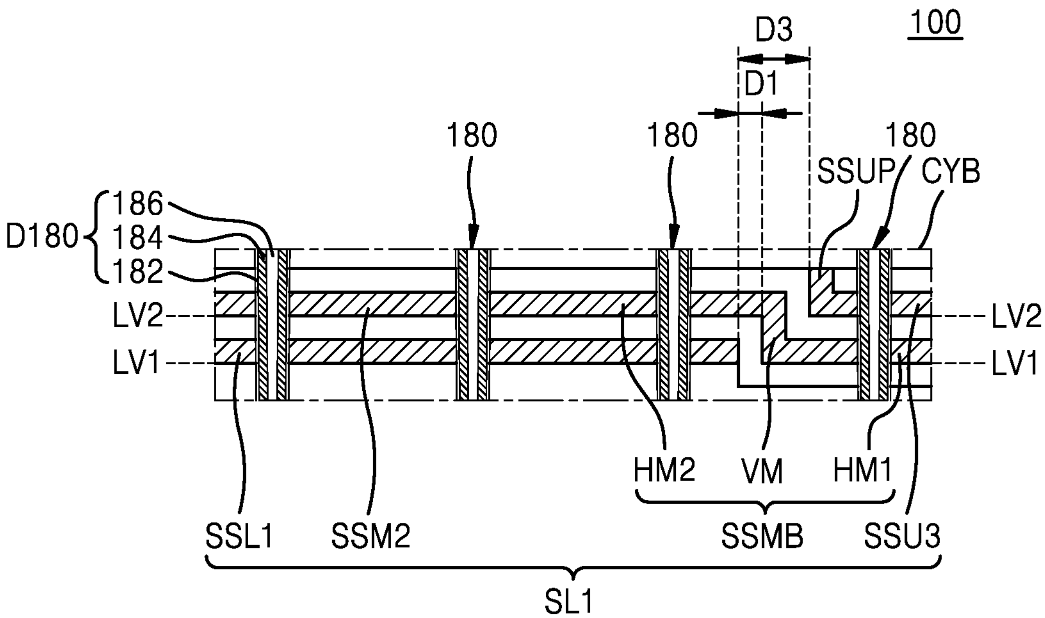
FIG. 2D is an enlarged cross-sectional view of a region CYB in FIG. 2B.

FIG. 1 is a plan view illustrating some components of an integrated circuit device according to embodiments of the inventive concept. FIG. 2A is a cross-sectional view taken along line A-A' of FIG. 1, and FIG. 2B is a cross-sectional view taken along line B-B' of FIG. 1. FIG. 2C is an enlarged cross-sectional view of a region CYA in FIG. 2A, and FIG. 2D is an enlarged cross-sectional view of a region CYB in FIG. 2B.

Referring to FIGS. 1 and 2A to 2D, an integrated circuit device 100 may include a substrate 102 including a memory cell region MEC and a connection region CON. The substrate 102 may include a main surface 102M extending in a horizontal direction along an X-Y plane. The substrate 102 may include Si, Ge, or SiGe. A memory cell array MCA may be formed over an active region AC of the memory cell region MEC.

The connection region CON may be arranged adjacent to an edge side of the memory cell region MEC. Although FIG. 1 illustrates only the connection region CON arranged on one side of the memory cell region MEC, the connection region CON may be arranged on each of both sides of the memory cell region MEC in a first horizontal direction (X direction).

The memory cell array MCA may include a memory stack STA1. The memory stack STA1 may include aground selection line GSL, a plurality of word lines WL1, WL2, . . . , WLn−1, and WLn, and a string selection line structure SL1.

The plurality of word lines WL1, WL2, . . . , WLn−1, and WLn may extend over the memory cell region MEC in a horizontal direction parallel to the main surface 102M of the substrate 102 and overlap each other in a vertical direction (Z direction). The memory stack STA1 may include 48, 64, or 96 word lines WL1, WL2, . . . , WLn−1, and WLn but is not limited thereto.

A plurality of word line cut regions WLC may extend in the first horizontal direction (X direction) parallel to the main surface 102M of the substrate 102. A unit block region UB may be defined by a pair of adjacent word line cut regions WLC among the plurality of word line cut regions WLC. The plurality of word line cut regions WLC may define the width of the plurality of word lines WL1, WL2, . . . , WLn−1, and WLn in the unit block region UB in a second horizontal direction (Y direction) perpendicular to the first horizontal direction (X direction).

A plurality of common source regions 172 may extend lengthwise in the first horizontal direction (X direction) in the substrate 102. In example embodiments, the plurality of common source regions 172 may be a doped region heavily doped with n-type dopants. The plurality of common source regions 172 may function as a source region for supplying a current to vertical memory cells. A plurality of common source patterns CSP may extend lengthwise in the first horizontal direction (X direction) over the plurality of common source regions 172. The plurality of common source patterns CSP may be formed to fill a portion of the word line cut region WLC on one side of each of the plurality of word lines WL1, WL2, . . . , WLn−1, and WLn. Both sidewalls of the common source pattern CSP may be surrounded by an insulating spacer 192 in the word line cut region WLC.

In the memory cell array MCA, a plurality of channel structures 180 and a plurality of dummy channel structures D180 may extend lengthwise through the memory stack STA1 in a vertical direction (Z direction) perpendicular to the main surface 102M of the substrate 102.

The string selection line structure SL1 may be arranged at a level higher than the level of the plurality of word lines WL1, WL2 . . . , WLn−1, and WLn. As used herein, the term "level" may mean the distance from the main surface 102M of the substrate 102 in the vertical direction (Z direction or −Z direction). The unit block region UB in the memory stack STA1 may include first to third string selection regions STR1, STR2, and STR3 that are sequentially arranged in the second horizontal direction (Y direction).

In the memory stack STA1, the string selection line structure SL1 may include a lower string selection line SSL1, an intermediate string selection line SSM2, an upper string selection line SSU3, and a string selection bent line SSMB.

As illustrated in FIGS. 2C and 2D, the string selection bent line SSMB may include a lower horizontal extension portion HM1 extending in the horizontal direction at a first level LV1, an upper horizontal extension portion HM2 extending in the horizontal direction at a second level LV2 higher than the first level LV1, and a vertical extension portion VM connected between the lower horizontal extension portion HM1 and the upper horizontal extension portion HM2. The lower horizontal extension portion HM1, the upper horizontal extension portion HM2, and the vertical extension portion VM may be integrally connected.

The string selection bent line SSMB may be arranged only in the second and third string selection regions STR2 and STR3 among the first to third string selection regions STR1, STR2, and STR3, the lower horizontal extension portion HM1 may be arranged in the third string selection region STR3, and the upper horizontal extension portion HM2 may be arranged in the second string selection region STR2. The vertical extension portion VM may be arranged between the second string selection region STR2 and the third string selection region STR3.

The lower string selection line SSL1 may be arranged only in the first and second string selection regions STR1 and STR2 among the first to third string selection regions STR1, STR2, and STR3. The lower string selection line SSL1 may extend in the horizontal direction at the first level LV1 and may be spaced apart from the lower horizontal extension portion HM1 of the string selection bent line SSMB in the second horizontal direction (Y direction). The lower string selection line SSL1 may overlap the upper horizontal extension portion HM2 of the string selection bent line SSMB in the vertical direction (Z direction) in the second string selection region STR2.

The intermediate string selection line SSM2 may be arranged only in the first string selection region STR1 among the first to third string selection regions STR1, STR2, and STR3. The intermediate string selection line SSM2 may extend in the horizontal direction at the second level LV2 and may be spaced apart from the upper horizontal extension portion HM2 of the string selection bent line SSMB in the second horizontal direction (Y direction).

The lower string selection line SSL1 and the intermediate string selection line SSM2 may overlap in the vertical direction (Z direction) in the first string selection region STR1.

The upper string selection line SSU3 may be arranged only in the third string selection region STR3 among the first to third string selection regions STR1, STR2, and STR3. The upper string selection line SSU3 may extend in the horizontal direction at the second level LV2 and may be spaced apart from the upper horizontal extension portion HM2 of the string selection bent line SSMB in the second horizontal direction (Y direction). Each of a bottom surface of the intermediate string selection line SSM2, a bottom surface of the upper string selection line SSU3, and a bottom surface of the upper horizontal extension portion HM2 of the string selection bent line SSMB may extend at the second level LV2. At the second level LV2, the upper string selection line SSU3 may be spaced apart from the intermediate string selection line SSM2 in the second horizontal direction (Y direction) with the upper horizontal extension portion HM2 of the string selection bent line SSMB therebetween. The upper string selection line SSU3 may overlap the plurality of word lines WL1, WL2, . . . , WLn−1, and WLn in the vertical direction (Z direction) with the lower horizontal extension portion HM1 of the string selection bent line SSMB therebetween.

The upper string selection line SSU3 may further include a protrusion portion SSUP extending at an end portion facing the upper horizontal extension portion HM2 of the string selection bent line SSMB from the second level LV2 to a level higher than the second level LV2 in a direction away from the substrate 102.

At the second level LV2, the intermediate string selection line SSM2 and the upper horizontal extension portion HM2 of the string selection bent line SSMB may be spaced apart from each other with a string selection line cut region SSLC therebetween. The string selection line cut region SSLC may be filled with an isolation insulating layer 178. The isolation insulating layer 178 may be arranged between the intermediate string selection line SSM2 and the upper horizontal extension portion HM2 of the string selection bent line SSMB at the second level LV2. The level of the bottom surface of the isolation insulating layer 178 closest to the substrate 102 may be higher than the first level LV1. The isolation insulating layer 178 may overlap the lower string selection line SSL1 in the vertical direction (Z direction).

As illustrated in FIG. 1, the isolation insulating layer 178 may include a plurality of isolation insulating portions 178P extending in a line in the first horizontal direction (X direction) between the first string selection region STR1 and the second string selection region STR2. The dummy channel structure D180 may extend lengthwise in the vertical direction (Z direction) between the respective isolation insulating portions 178P. The isolation insulating layer 178 may include an oxide layer. At least a portion of the string selection line cut region SSLC may be filled with an air gap.

A first minimum spacing distance D1 may be maintained between the lower string selection line SSL1 and the lower horizontal extension portion HM1 of the string selection bent line SSMB at the first level LV1. A second minimum spacing distance D2 may be maintained between the intermediate string selection line SSM2 and the upper horizontal extension portion HM2 of the string selection bent line SSMB at the second level LV2. A third minimum spacing distance D3 between the lower string selection line SSL1 and the upper string selection line SSU3 in the first horizontal direction (X direction) may be greater than the first minimum spacing distance D1.

The plurality of channel structures 180 may include a plurality of first channel structures 180A arranged in the first string selection region STR1, a plurality of second channel structures 180B arranged in the second string selection region STR2, and a plurality of third channel structures 180C arranged in the third string selection region STR3. The plurality of first channel structures 180A may pass through the ground selection line GSL, the plurality of word lines WL1, WL2, . . . , WLn−1, and WLn, the lower string selection line SSL1, and the intermediate string selection line SSM2. The plurality of second channel structures 180B may pass through the ground selection line GSL, the plurality of word lines WL1, WL2, . . . , WLn−1, and WLn, the lower string selection line SSL1, and the upper horizontal extension portion HM2 of the string selection bent line SSMB. The plurality of third channel structures 180C may pass through the ground selection line GSL, the plurality of word lines WL1, WL2, . . . , WLn−1, and WLn, the lower horizontal extension portion HM1 of the string selection bent line SSMB, and the upper string selection line SSU3.

The plurality of dummy channel structures D180 may include a plurality of first dummy channel structures D180A arranged in a line in the first horizontal direction (X direction) between the first string selection region STR1 and the second string selection region STR2 and a plurality of second dummy channel structures D180B arranged in a line in the first horizontal direction (X direction) between the second string selection region STR2 and the third string selection region STR3. The plurality of first dummy channel structures D180A may be arranged in a line in the first horizontal direction (X direction) between the intermediate string selection line SSM2 and the upper horizontal extension portion HM2 of the string selection bent line SSMB and may be respectively arranged one by one between the plurality of isolation insulating portions 178P. The plurality of second dummy channel structures D180B may pass through the string selection bent line SSMB between the lower string selection line SSL1 and the upper string selection line SSU3.

Each of the ground selection line GSL, the plurality of word lines WL1, WL2, . . . , WLn−1, and WLn, and the string selection line structure SL1 may include a metal, a metal silicide, a doped semiconductor, or a combination thereof. The metal may include tungsten, nickel, cobalt, or tantalum. The metal silicide may include a tungsten silicide, a nickel silicide, a cobalt silicide, or a tantalum silicide. The doped semiconductor may include polysilicon.

An insulating layer 176 may be arranged between the substrate 102 and the ground selection line GSL and between each of the ground selection line GSL and the plurality of word lines WL1, WL2, . . . , WLn−1, and WLn. A first insulating layer 176A may be arranged between the plurality of word lines WL1, WL2, . . . , WLn−1, and WLn and the string selection line structure SL1. A second insulating layer 176B may be arranged between the lower string selection line SSL1 and the intermediate string selection line SSM2, between the lower string selection line SSL1 and the string selection bent line SSMB, and between the first insulating layer 176A and the string selection bent line SSMB. A third insulating layer 176C may be arranged between the string selection bent line SSMB and the upper string selection line SSU3. The third insulating layer 176C may include a portion covering an upper surface of the intermediate string selection line SSM2 and an upper surface of the string selection bent line SSMB. An upper surface of the upper string selection line SSU3 may be covered with a fourth insulating layer 176D. The third insulating layer 176C and the fourth insulating layer 176D may be covered with a fifth insulating layer 176E.

The insulating layer 176 and the first to fifth insulating layers 176A, 176B, 176C, 176D, and 176E may surround the plurality of channel structures 180 and the plurality of dummy channel structures D180, respectively. Each of the insulating layer 176 and the first to fifth insulating layers 176A, 176B, 176C, 176D, and 176E may include a silicon oxide, a silicon nitride, or a silicon oxynitride.

The plurality of channel structures 180 and the plurality of dummy channel structures D180 may be arranged to be spaced apart from each other at certain intervals in the X direction and the Y direction. Each of the plurality of channel structures 180 and the plurality of dummy channel structures D180 may include a gate dielectric layer 182, a channel region 184, a buried insulating layer 186, and a drain region 188.

The channel region 184 may include doped polysilicon and/or undoped polysilicon. The channel region 184 may have a cylindrical shape. An inner space of the channel region 184 may be filled with the buried insulating layer 186. The buried insulating layer 186 may include an insulating material. For example, the buried insulating layer 186 may include a silicon oxide, a silicon nitride, a silicon oxynitride, or a combination thereof. In example embodiments, the buried insulating layer 186 may be omitted, and in this case, the channel region 184 may have a pillar structure without an insulating space therein. A plurality of drain regions 188 of the plurality of channel structures 180 may be insulated from each other by an upper insulating layer 187. The plurality of drain regions 188 may include doped polysilicon, a metal, a conductive metal nitride, or a combination thereof. Examples of the metal that may constitute the plurality of drain regions 188 may include tungsten, nickel, cobalt, tantalum, and the like. The upper insulating layer 187 may include an oxide layer, a nitride layer, or a combination thereof.

The plurality of word line cut regions WLC, the plurality of channel structures 180, the plurality of dummy channel structures D180, and the upper insulating layer 187 may be covered with an interlayer insulating layer 193. In the memory cell region MEC, a plurality of bit lines BL may extend in parallel to each other in the second horizontal direction (Y direction) on the interlayer insulating layer 193. A plurality of contact plugs 194 may be arranged between the plurality of channel structures 180 and the plurality of bit lines BL. The drain region 188 of each of the plurality of channel structures 180 may be connected to a corresponding bit line BL among the plurality of bit lines BL through the contact plug 194. The plurality of contact plugs 194 may fill a plurality of contact holes 193H formed in the interlayer insulating layer 193. The plurality of contact plugs 194 may be insulated from each other by the interlayer insulating layer 193. The interlayer insulating layer 193 may include an oxide layer, a nitride layer, or a combination thereof.

Each of the plurality of channel structures 180 may be a normal channel structure that is connected to any one of the plurality of bit lines BL to constitute a memory cell string of the memory cell array MCA. On the other hand, each of the plurality of dummy channel structures D180 may be a dummy channel structure that is not connected to the bit line BL and do not contribute to the operation of the memory cell array MCA.

Although FIGS. 2A to 2D illustrate a case in which the plurality of channel structures 180 and the plurality of dummy channel structures D180 include the gate dielectric layer 182 and the gate dielectric layer 182 has a shape extending lengthwise in the vertical direction (Z direction) along the channel region 184, the inventive concept is not limited thereto.

Figure 3A:
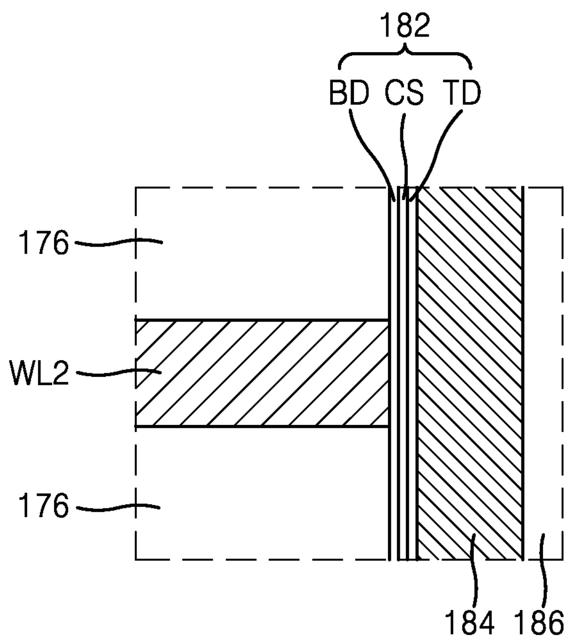
FIGS. 3A to 3D are cross-sectional views illustrating in more detail a gate dielectric layer of an integrated circuit device according to embodiments of the inventive concept.

FIG. 3A is a cross-sectional view illustrating in more detail the gate dielectric layer 182 illustrated in FIGS. 2A to 2D, which illustrates an enlarged view of a region CZ in FIG. 2A.

Referring to FIG. 3A, the gate dielectric layer 182 may have a structure including a tunneling dielectric layer TD, a charge storage layer CS, and a blocking dielectric layer BD that are sequentially formed from the channel region 184. The relative thicknesses of the tunneling dielectric layer TD, the charge storage layer CS, and the blocking dielectric layer BD are not limited to those illustrated in FIG. 3A and may be variously modified.

The tunneling dielectric layer TD may include a silicon oxide, a hafnium oxide, an aluminum oxide, a zirconium oxide, a tantalum oxide, or the like. The charge storage layer CS may be a region in which electrons passing through the tunneling dielectric layer TD from the channel region 184 may be stored and may include a silicon nitride, a boron nitride, a silicon boron nitride, or doped polysilicon. The blocking dielectric layer BD may include a silicon oxide, a silicon nitride, or a metal oxide having a higher dielectric constant than a silicon oxide. The metal oxide may include a hafnium oxide, an aluminum oxide, a zirconium oxide, a tantalum oxide, or a combination thereof.

Figure 3B:
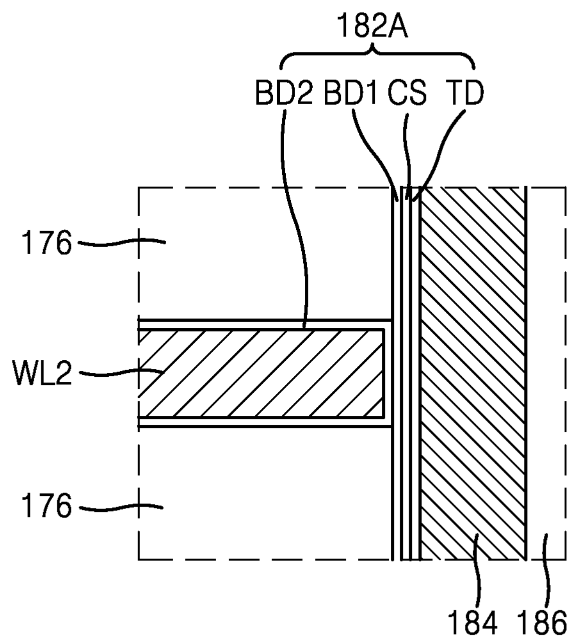
Figure 3C:
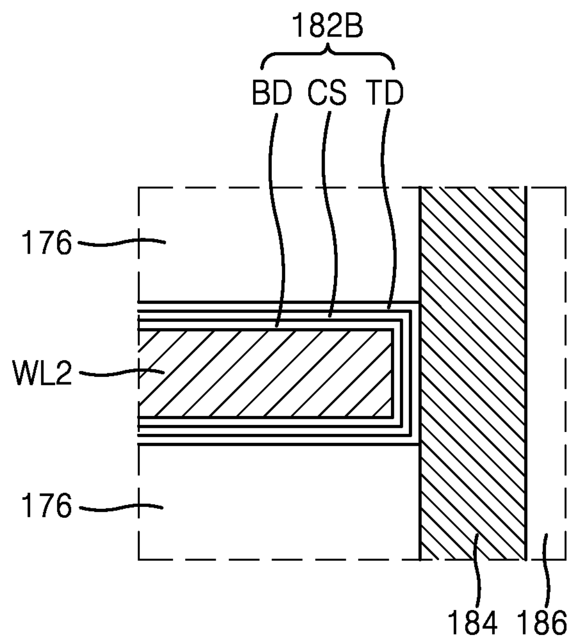
Figure 3D:
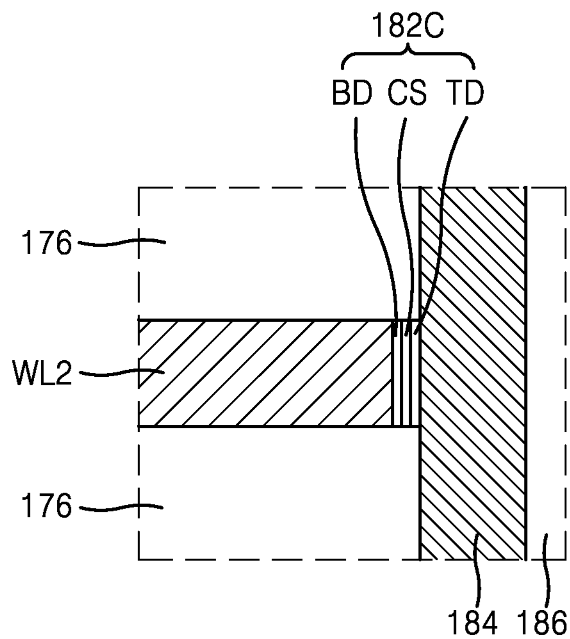

FIGS. 3B to 3D are cross-sectional views illustrating example structures of gate dielectric layers 182A, 182B, and 182C that may be used instead of the gate dielectric layer 182 illustrated in FIG. 3A.

In example embodiments, the integrated circuit device 100 may include the gate dielectric layer 182A illustrated in FIG. 3B, instead of the gate dielectric layer 182. The gate dielectric layer 182A may have substantially the same configuration as the gate dielectric layer 182 illustrated in FIG. 3A. However, the gate dielectric layer 182A may include a first blocking dielectric layer BD1 and a second blocking dielectric layer BD2, instead of the blocking dielectric layer BD. The first blocking dielectric layer BD1 may extend in parallel to the channel region 184 together with the tunneling dielectric layer TD and the charge storage layer CS, and the second blocking dielectric layer BD2 may be arranged to surround the word line WL2. Each of the first blocking dielectric layer BD1 and the second blocking dielectric layer BD2 may include a silicon oxide, a silicon nitride, or a metal oxide. For example, the first blocking dielectric layer BD1 may include a silicon oxide layer, and the second blocking dielectric layer BD2 may include a metal oxide layer having a higher dielectric constant than a silicon oxide layer.

In other example embodiments, the integrated circuit device 100 may include the gate dielectric layer 182B illustrated in FIG. 3C, instead of the gate dielectric layer 182. The gate dielectric layer 182B may have a surface facing the channel region 184 and surfaces facing the insulating layer 176 in the word line WL2 and may be formed to cover the bottom surface, the top surface, and the sidewall of the word line WL2. The gate dielectric layer 182B may include a tunneling dielectric layer TD, a charge storage layer CS, and a blocking dielectric layer BD that are sequentially formed from the channel region 184.

In other example embodiments, the integrated circuit device 100 may include the gate dielectric layer 182C illustrated in FIG. 3D, instead of the gate dielectric layer 182. The gate dielectric layer 182C may be arranged only between the word line WL2 and the channel region 184 and may be formed to cover only the sidewall of the word line WL2 without covering the bottom surface and top surface of the word line WL2. The gate dielectric layer 182C may include a tunneling dielectric layer TD, a charge storage layer CS, and a blocking dielectric layer BD that are sequentially formed from the channel region 184.

As illustrated in FIG. 1, in the connection region CON, a plurality of contacts 132 may be formed at a stepped connection unit 122 of the ground selection line GSL and a stepped connection unit 124 of each of the plurality of word lines WL1, WL2, . . . , WLn−1, and WLn. Also, in the connection region CON, first to fourth contacts 134A, 134B, 134C, and 134D may be formed at the string selection line structure SL1. The first contact 134A may be connected to a connection region S1 of the lower string selection line SSL1. The second contact 134B may be connected to a connection region S2 of the intermediate string selection line SSM2. The third contact 134C may be connected to a connection region S3 of the upper string selection line SSU3. The fourth contact 134D may be connected to a connection region S4 of the string selection bent line SSMB.

The on or off of each of the lower string selection line SSL1, the intermediate string selection line SSM2, the upper string selection line SSU3, and the string selection bent line SSMB may be determined according to a voltage applied through the first to fourth contacts 134A, 134B, 134C, and 134D. Any one of the first to third string selection regions STR1, STR2, and STR3 may be selected according to a voltage applied to the first to fourth contacts 134A, 134B, 134C, and 134D. For example, in order to select only the first string selection region STR1 among the first to third string selection regions STR1, STR2, and STR3, the lower string selection line SSL1 and the intermediate string selection line SSM2 may be turned on and the upper string selection line SSU3 and the string selection bent line SSMB may be turned off. In order to select only the second string selection region STR2 among the first to third string selection regions STR1, STR2, and STR3, the lower string selection line SSL1 and the string selection bent line SSMB may be turned on and the intermediate string selection line SSM2 and the upper string selection line SSU3 may be turned off. In order to select only the third string selection region STR3 among the first to third string selection regions STR1, STR2, and STR3, the string selection bent line SSMB and the upper string selection line SSU3 may be turned on and the lower string selection line SSL1 and the intermediate string selection line SSM2 may be turned off.

According to the integrated circuit device 100 described with reference to FIGS. 1 and 2A to 2D, because three string selection regions including the first to third string selection regions STR1, STR2, and STR3 are included in one unit block region UB, the width of one unit block region UB in the second horizontal direction (Y direction) may be increased as compared with the case of including two string selection regions in one unit block region UB. Thus, even when the number of stacks of word lines WL1, WL2, . . . , WLn−1, and WLn stacked in the vertical direction in the memory cell region MEC is increased for improvement of the integration degree, an undesirable physical modification such as falling or leaning of the memory stack STA1 may be prevented. Also, the number of channel structures per unit area in the memory cell region MEC may be increased because three string selection regions including the first to third string selection regions STR1, STR2, and STR3 are included in one unit block region UB. Thus, the integration degree of the integrated circuit device 100 may be efficiently improved even without increasing the chip size thereof.

Figure 4A:
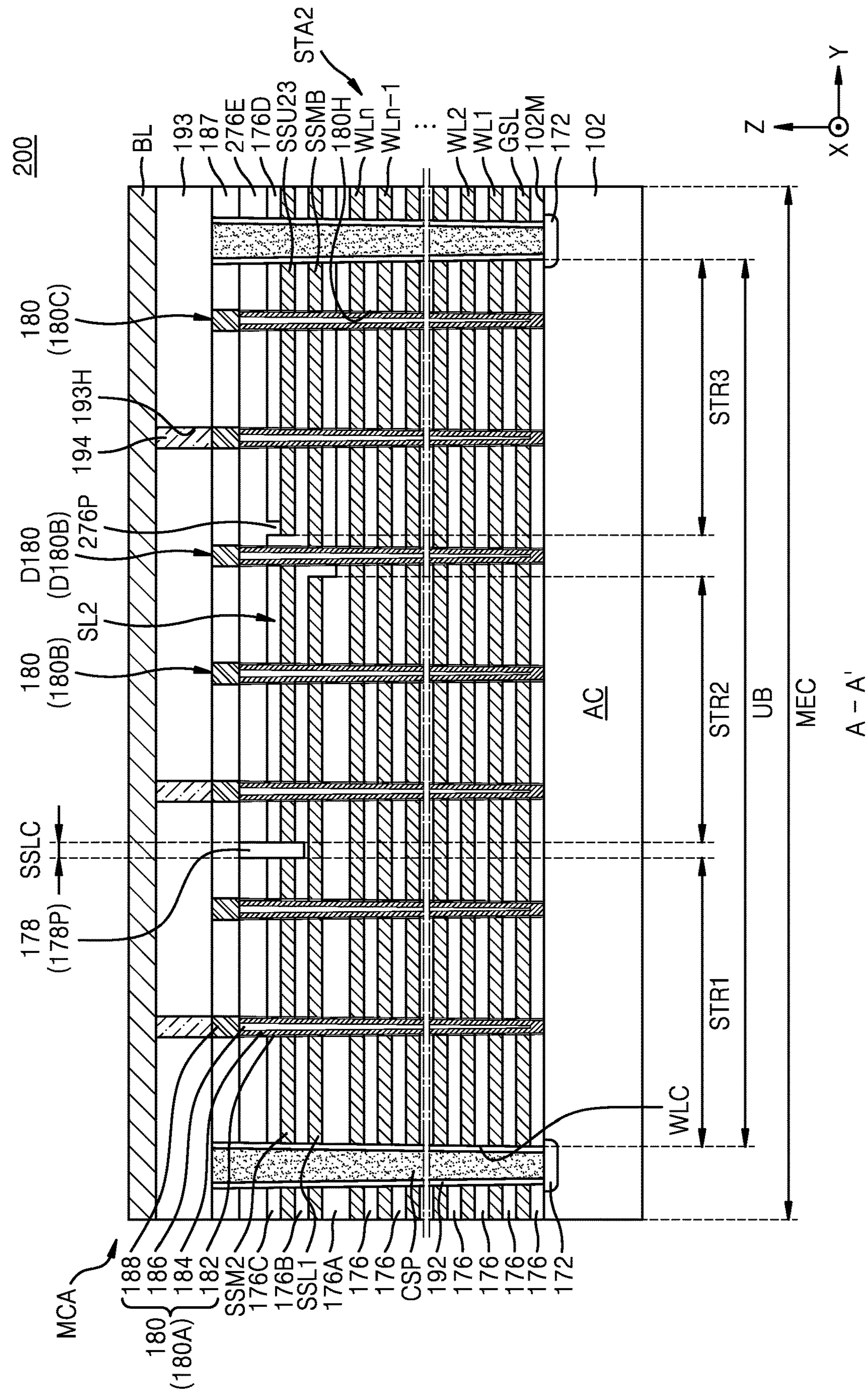
FIGS. 4A and 4B are cross-sectional views illustrating an integrated circuit device according to other embodiments of the inventive concept.
Figure 4B:
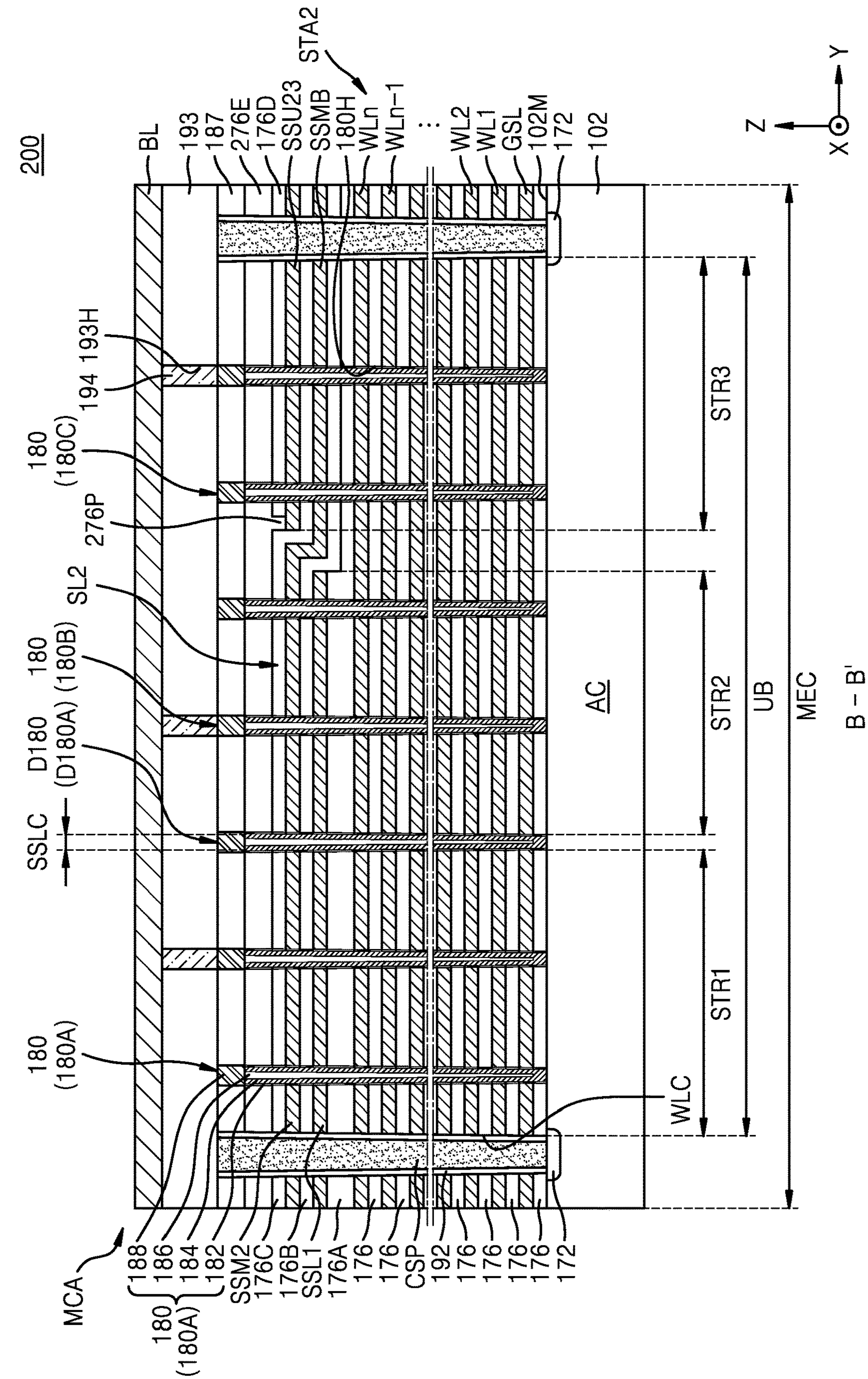

FIGS. 4A and 4B are cross-sectional views illustrating an integrated circuit device according to other embodiments of the inventive concept, wherein FIG. 4A is a cross-sectional view of a portion corresponding to the cross-section taken along the line A-A' of FIG. 1 and FIG. 4B is a cross-sectional view of a portion corresponding to the cross-section taken along the line B-B' of FIG. 1. In FIGS. 4A and 4B, the same reference numerals as in FIGS. 2A to 2D denote the same elements, and redundant descriptions thereof will be omitted for conciseness.

Referring to FIGS. 4A and 4B, an integrated circuit device 200 may include a memory stack STA2 including a string selection line structure SL2. The string selection line structure SL2 may have substantially the same configuration as the string selection line structure SL1 of the integrated circuit device 100 illustrated in FIGS. 1 and 2A to 2D. However, the string selection line structure SL2 may include an upper string selection line SSU23 instead of the upper string selection line SSU3. Unlike the upper string selection line SSU3, the upper string selection line SSU23 may have a flat upper surface without including the protrusion portion SSUP.

The integrated circuit device 200 may include a fifth insulating layer 276E covering the string selection line structure SL2. The fifth insulating layer 276E may include an insulating protrusion portion 276P that protrudes downward in the vertical direction (Z direction) toward the substrate 102 and contacts an upper surface of the upper string selection line SSU23. The insulating protrusion portion 276P may be arranged between the third insulating layer 176C and the fourth insulating layer 176D.

More detailed configurations of the upper string selection line SSU23 and the fifth insulating layer 276E may be substantially the same as those described with respect to the upper string selection line SSU3 and the fifth insulating layer 176E illustrated in FIGS. 2A and 2B.

Figure 5A:
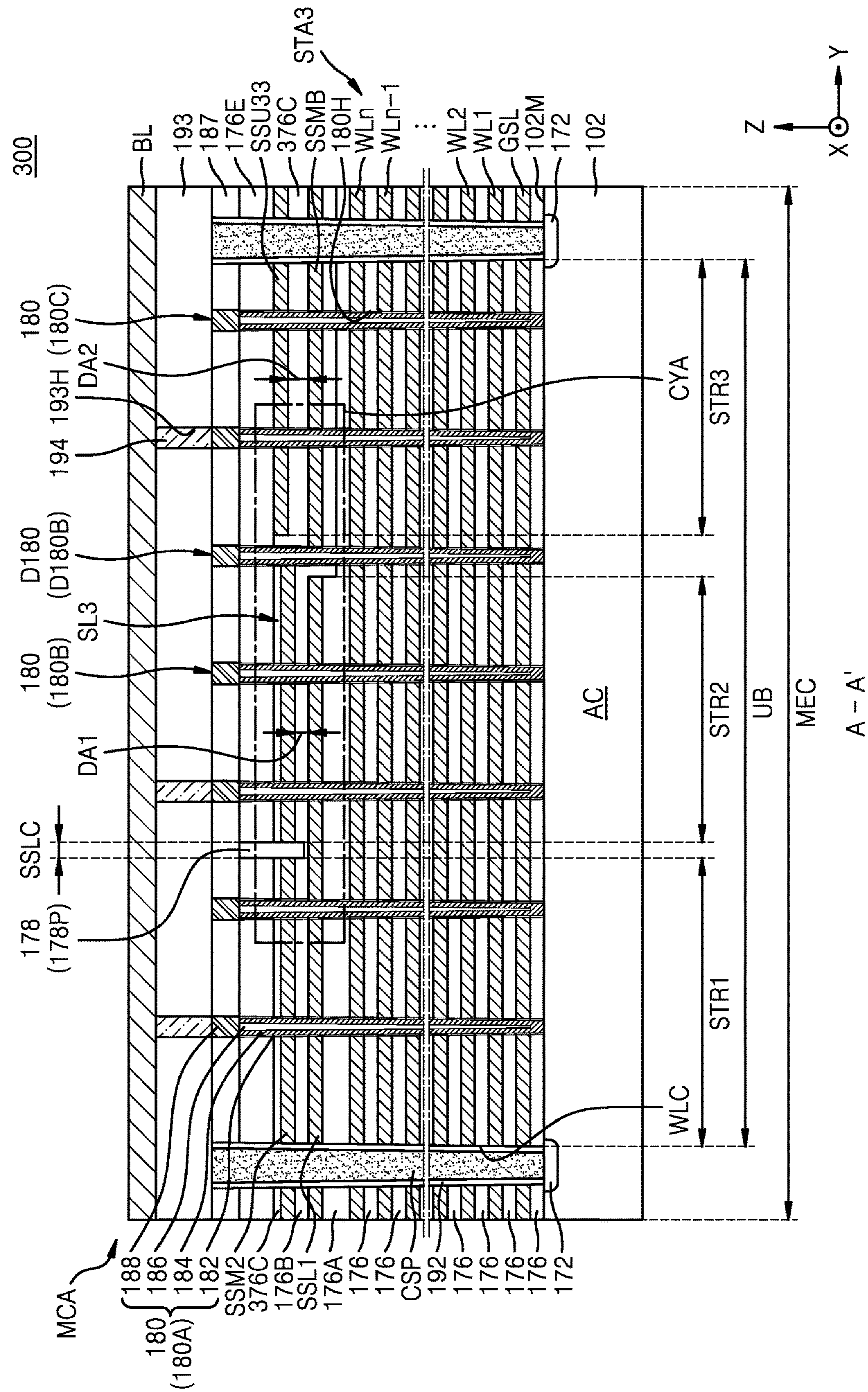
FIGS. 5A and 5B are cross-sectional views illustrating an integrated circuit device according to other embodiments of the inventive concept.
Figure 5B:
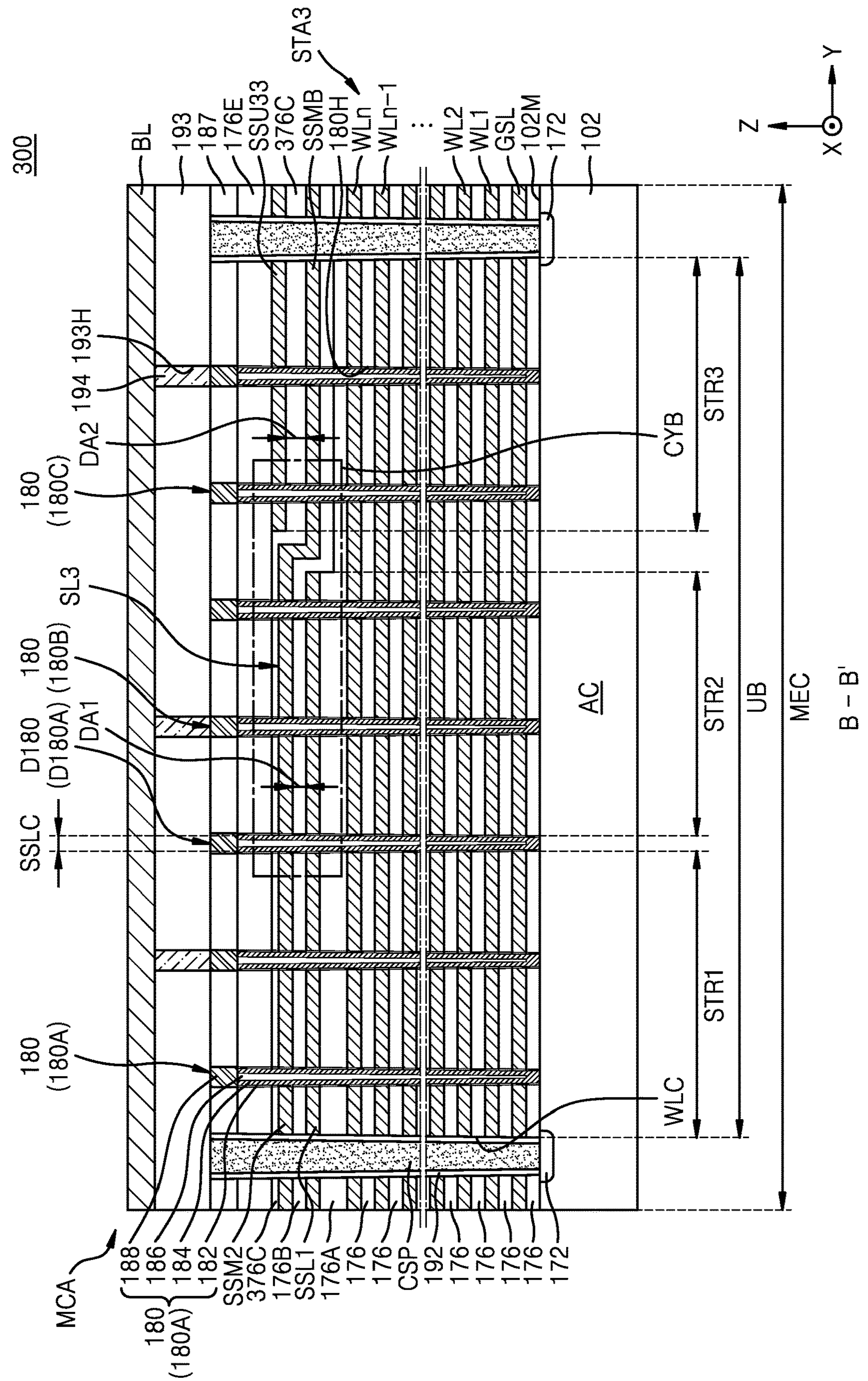
Figure 5C:
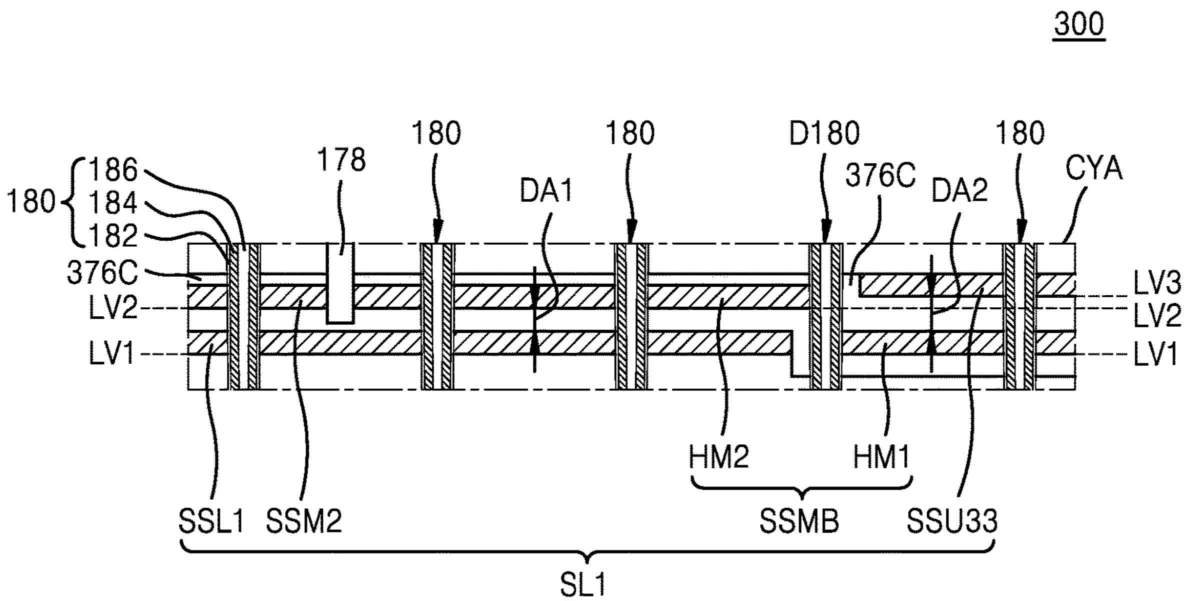
FIG. 5C is an enlarged cross-sectional view of a region CYA in FIG. 5A.
Figure 5D:
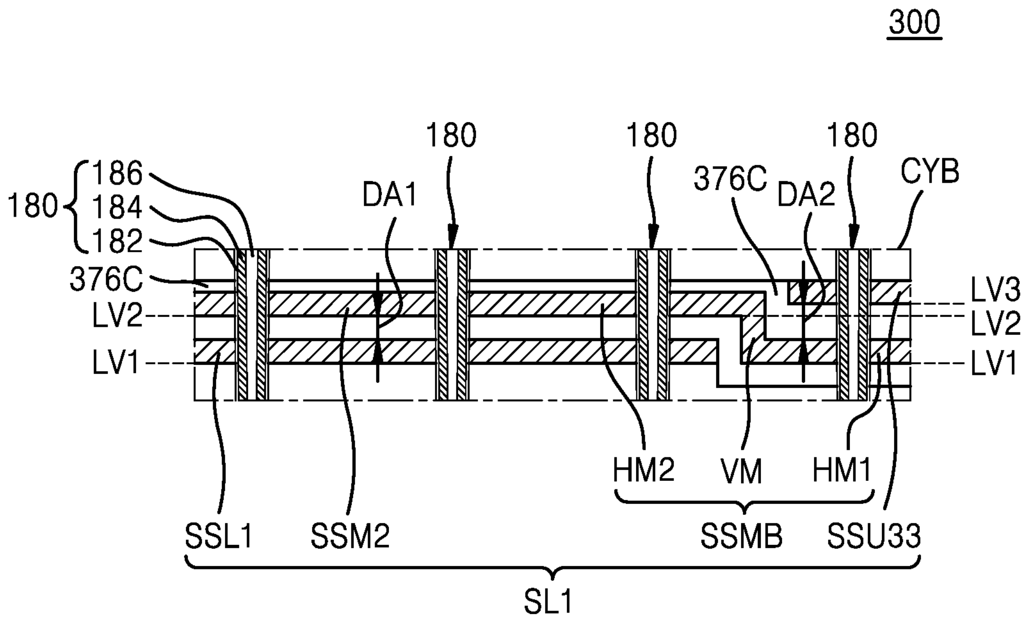
FIG. 5D is an enlarged cross-sectional view of a region CYB in FIG. 5B.

FIGS. 5A to 5D are cross-sectional views illustrating an integrated circuit device according to other embodiments of the inventive concept, wherein FIG. 5A is a cross-sectional view of a portion corresponding to the cross-section taken along the line A-A' of FIG. 1, FIG. 5B is a cross-sectional view of a portion corresponding to the cross-section taken along the line B-B' of FIG. 1, FIG. 5C is an enlarged cross-sectional view of a region CYA in FIG. 5A, and FIG. 5D is an enlarged cross-sectional view of a region CYB in FIG. 5B. In FIGS. 5A to 5D, the same reference numerals as in FIGS. 2A to 2D denote the same elements, and redundant descriptions thereof will be omitted for conciseness.

Referring to FIGS. 5A and 5B, an integrated circuit device 300 may include a memory stack STA3 including a string selection line structure SL3. The string selection line structure SL3 may have substantially the same configuration as the string selection line structure SL2 illustrated in FIGS. 4A and 4B. However, the string selection line structure SL3 may include an upper string selection line SSU33 instead of the upper string selection line SSU23. The bottom level of the upper string selection line SSU33 may be a third level LV3 that is higher than the second level LV2. The upper string selection line SSU33 may extend in the horizontal direction at the third level LV3. The bottom level of the upper string selection line SSU33 may be higher than the bottom level of the upper horizontal extension portion HM2 of the string selection bent line SSMB.

In the integrated circuit device 300, a third insulating layer 376C may be arranged between the string selection bent line SSMB and the upper string selection line SSU33. A thickness DA2 of the third insulating layer 376C may be greater than a thickness DA1 of the second insulating layer 176B.

More detailed configurations of the upper string selection line SSU33 and the third insulating layer 376C may be substantially the same as those described with respect to the upper string selection line SSU3 and the third insulating layer 176C illustrated in FIGS. 2A and 2B.

Figure 6:
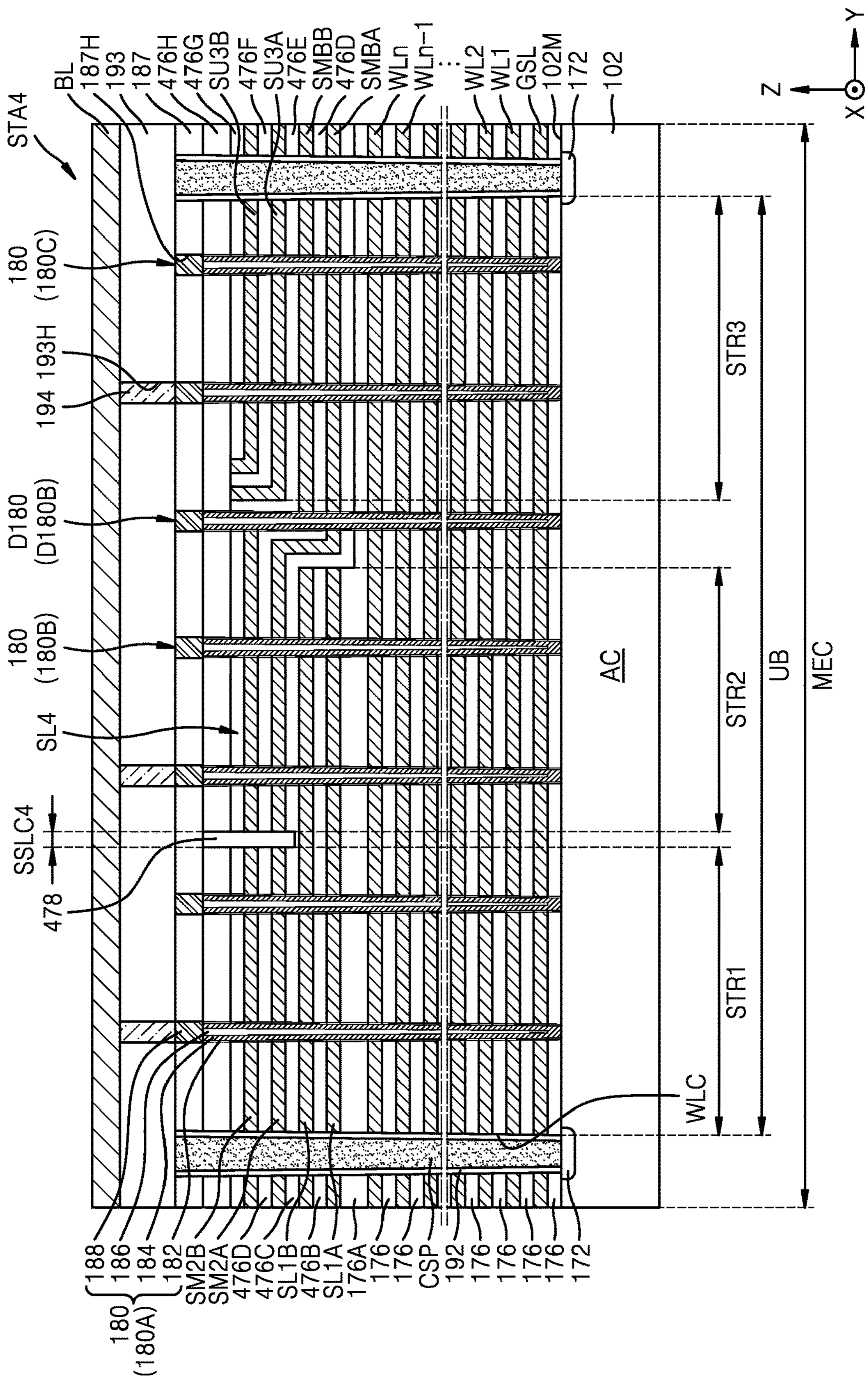
FIG. 6 is a cross-sectional view illustrating an integrated circuit device according to other embodiments of the inventive concept.

FIG. 6 is a cross-sectional view illustrating an integrated circuit device according to other embodiments of the inventive concept. In FIG. 6, the same reference numerals as in FIGS. 2A to 2D denote the same elements, and redundant descriptions thereof will be omitted for conciseness.

Referring to FIG. 6, an integrated circuit device 400 may include a memory stack STA4 including a string selection line structure SL4. The string selection line structure SL4 may include first and second lower string selection lines SL1A and SL1B, first and second intermediate string selection lines SM2A and SM2B, first and second upper string selection lines SU3A and SU3B, and first and second string selection bent lines SMBA and SMBB.

The first and second lower string selection lines SL1A and SL1B, the first and second intermediate string selection lines SM2A and SM2B, the first and second upper string selection lines SU3A and SU3B, and the first and second string selection bent lines SMBA and SMBB may receive a voltage through string selection contacts having the same or similar configuration as the first to fourth contacts 134A, 134B, 134C, and 134D illustrated in FIG. 1. The on or off of each of the first and second lower string selection lines SL1A and SL1B, the first and second intermediate string selection lines SM2A and SM2B, the first and second upper string selection lines SU3A and SU3B, and the first and second string selection bent lines SMBA and SMBB may be determined according to a voltage applied through the string selection contacts. In example embodiments, the first and second lower string selection lines SL1A and SL1B may be turned on together or turned off together. The first and second intermediate string selection lines SM2A and SM2B may be turned on together or turned off together. The first and second upper string selection lines SU3A and SU3B may be turned on together or turned off together. The first and second string selection bent lines SMBA and SMBB may be turned on together or turned off together.

Similarly to a method of selecting any one of the first to third string selection regions STR1, STR2, and STR3 with reference to FIGS. 1 and 2A to 2D, in the integrated circuit device 400, any one of the first to third string selection regions STR1, STR2, and STR3 may be selected by using a voltage applied through the string selection contacts.

In order to select only the first string selection region STR1 among the first to third string selection regions STR1, STR2, and STR3, the first and second lower string selection lines SL1A and SL1B and the first and second intermediate string selection lines SM2A and SM2B may be turned on and the first and second upper string selection lines SU3A and SU3B and the first and second string selection bent lines SMBA and SMBB may be turned off. In order to select only the second string selection region STR2 among the first to third string selection regions STR1. STR2, and STR3, the first and second lower string selection lines SL1A and SL1B and the first and second string selection bent lines SMBA and SMBB may be turned on and the first and second intermediate string selection lines SM2A and SM2B and the first and second upper string selection lines SU3A and SU3B may be turned off. In order to select only the third string selection region STR3 among the first to third string selection regions STR1, STR2, and STR3, the first and second string selection bent lines SMBA and SMBB and the first and second upper string selection lines SU3A and SU3B may be turned on and the first and second lower string selection lines SL1A and SL1B and the first and second intermediate string selection lines SM2A and SM2B may be turned off.

More detailed configurations of the first and second lower string selection lines SL1A and SL1B, the first and second intermediate string selection lines SM2A and SM2B, the first and second upper string selection lines SU3A and SU3B, and the first and second string selection bent lines SMBA and SMBB may be substantially the same as those described with respect to the lower string selection line SSL1, the intermediate string selection line SSM2, the upper string selection line SSU3, and the string selection bent line SSMB with reference to FIGS. 1 and 2A to 2D.

The first and second intermediate string selection lines SM2A and SM2B and the first and second string selection bent lines SMBA and SMBB may be spaced apart from each other with a string selection line cut region SSLC4 therebetween. The string selection line cut region SSLC4 may be filled with an isolation insulating layer 478. The isolation insulating layer 478 may overlap the first and second lower string selection lines SL1A and SL1B in the vertical direction (Z direction). The isolation insulating layer 478 may include a silicon oxide layer.

A second insulating layer 476B may be arranged between the first and second lower string selection lines SL1A and SL1B. A third insulating layer 476C may be arranged between the second lower string selection line SL1B and the first intermediate string selection line SM2A and between the second lower string selection line SL1B and the first string selection bent line SMBA. A fourth insulating layer 476D may be arranged between the first and second intermediate string selection lines SM2A and SM2B and between the first and second string selection bent lines SMBA and SMBB. A fifth insulating layer 476E may be arranged between the second string selection bent line SMBB and the first upper string selection line SU3A. A sixth insulating layer 476F may be arranged between the first and second upper string selection lines SU3A and SU3B. The second upper string selection line SU3B may be covered with a seventh insulating layer 476G. The string selection line structure SL4 may be covered with an eighth insulating layer 476H. Each of the second to eighth insulating layers 476B, 476C, 476D, 476E, 476F, 476G, and 476H may include a silicon oxide layer.

Figure 7:
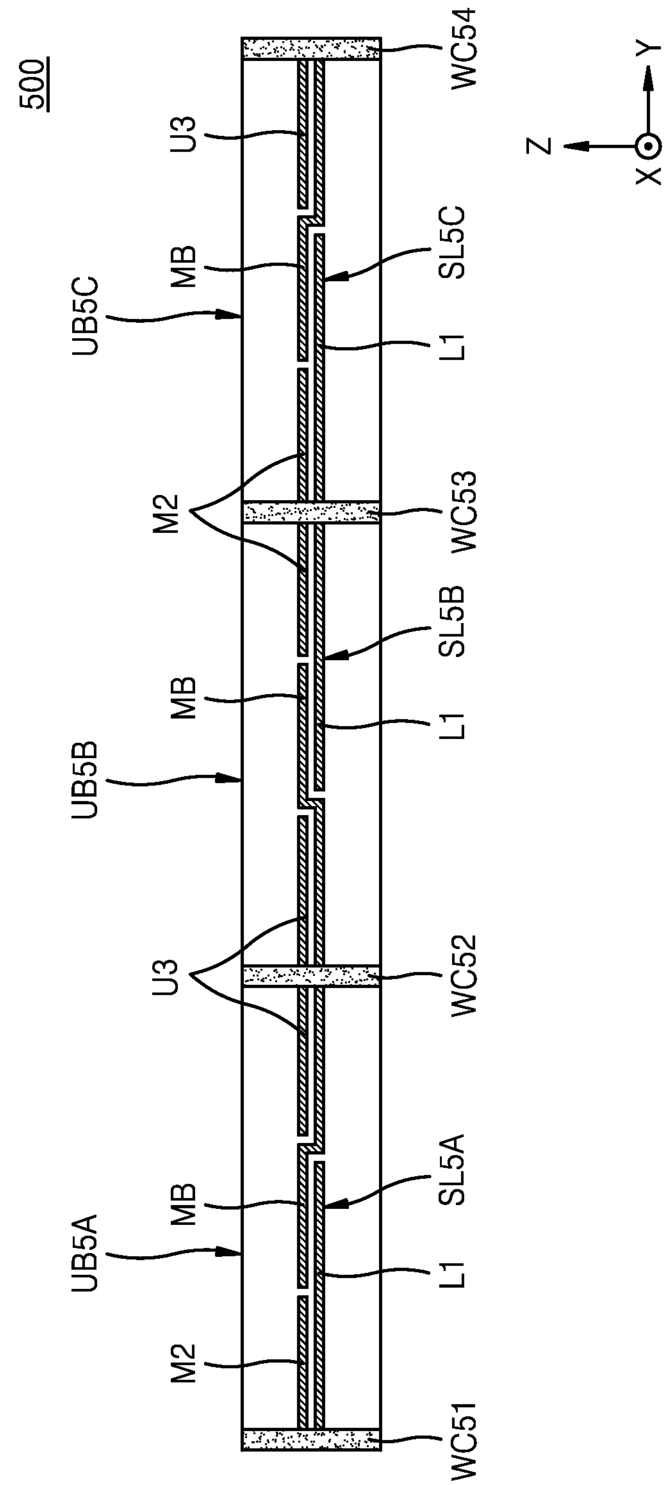
FIG. 7 is a schematic cross-sectional view illustrating an integrated circuit device according to other embodiments of the inventive concept.

FIG. 7 is a schematic cross-sectional view illustrating an integrated circuit device according to other embodiments of the inventive concept.

Referring to FIG. 7, an integrated circuit device 500 may include a plurality of word line cut regions WC51, WC52, WC53, and WC54 and a plurality of unit block regions UB5A, UB5B, and UB5C that are respectively arranged one by one between the plurality of word line cut regions WC51, WC52, WC53, and WC54.

Each of the plurality of unit block regions UB5A, UB5B, and UB5C may have substantially the same configuration as the unit block region UB of the integrated circuit device 100 described with reference to FIGS. 1 and 2A to 2D. However, the plurality of unit block regions UB5A, UB5B, and UB5C may include string selection line structures SL5A, SL5B, and SL5C instead of the string selection line structure SL1. In FIG. 7, other configurations other than the string selection line structures SL5A, SL5B, and SL5C among the configurations of the plurality of unit block regions UB5A, UB5B, and UB5C are not illustrated. Each of the plurality of word line cut regions WC51, WC52, WC53, and WC54 may have the same or similar configuration as the word line cut region WLC of the integrated circuit device 100 described with reference to FIGS. 1 and 2A to 2D.

Each of the string selection line structures SL5A, SL5B, and SL5C may include a lower string selection line L1, an intermediate string selection line M2, an upper string selection line U3, and a string selection bent line MB. The lower string selection line L1, the intermediate string selection line M2, and the string selection bent line MB may respectively have the same or similar configurations as those described with respect to the lower string selection line SSL1, the intermediate string selection line SSM2, and the string selection bent line SSMB illustrated in FIGS. 2A to 2D. The upper string selection line U3 may have the same or similar configuration as that described with respect to the upper string selection line SSU3 illustrated in FIGS. 2A to 2D, the upper string selection line SSU23 illustrated in FIGS. 4A and 4B, or the upper string selection line SSU33 illustrated in FIGS. 5A to 5D.

The cross-sectional configurations of the string selection line structures SL5A. SL5B, and SL5C in two adjacent unit block regions among the plurality of unit block regions UB5A, UB5B, and UB5C may have a mirror-image symmetrical structure with respect to the word line cut regions WC52 and WC53 located therebetween, respectively. For example, the unit block region UB5A and the unit block region UB5B may be adjacent to each other with the word line cut region WC52 therebetween, and the string selection line structure SL5A of the unit block region UB5A and the string selection line structure SL5B of the unit block region UB5B may have a mirror-image symmetrical structure with respect to the word line cut region WC52. Also, the unit block region UB5B and the unit block region UB5C may be adjacent to each other with the word line cut region WC53 therebetween, and the string selection line structure SL5B of the unit block region UB5B and the string selection line structure SL5C of the unit block region UB5C may have a mirror-image symmetrical structure with respect to the word line cut region WC53.

Figure 8:
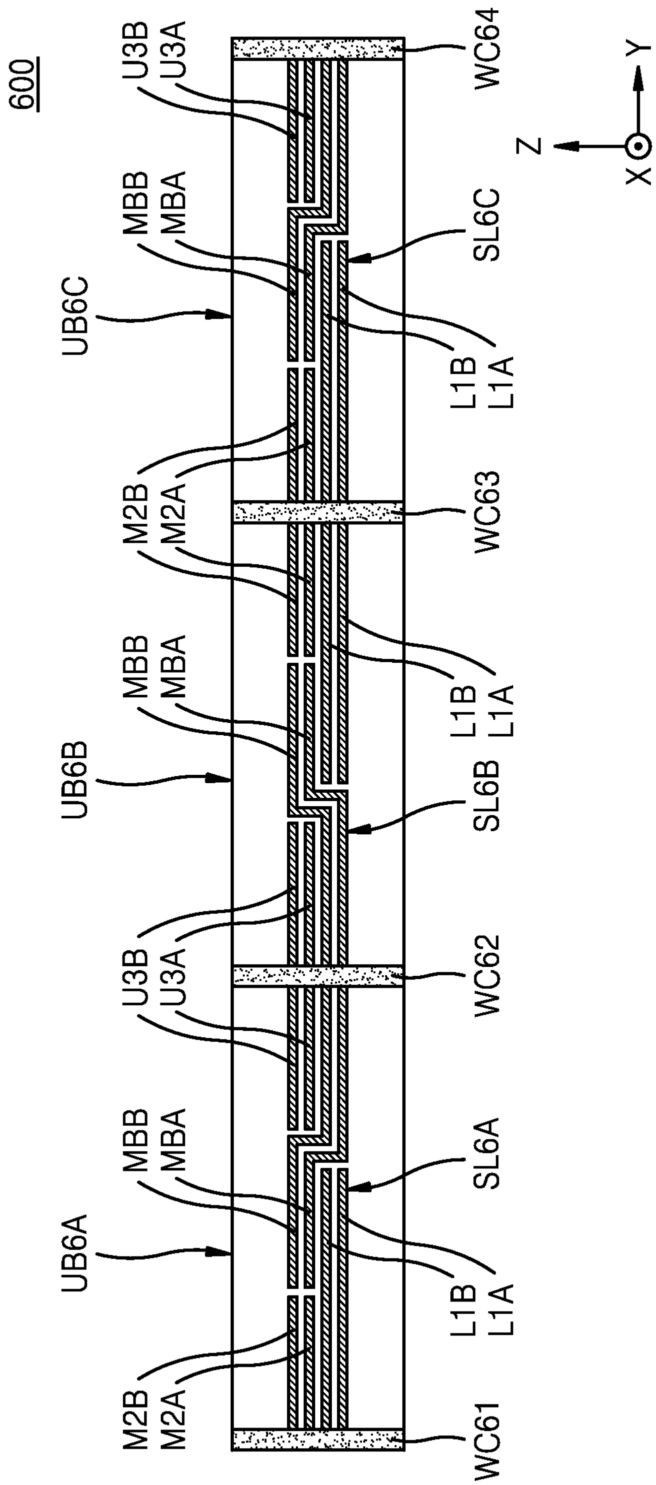
FIG. 8 is a schematic cross-sectional view illustrating an integrated circuit device according to other embodiments of the inventive concept.

FIG. 8 is a schematic cross-sectional view illustrating an integrated circuit device according to other embodiments of the inventive concept.

Referring to FIG. 8, an integrated circuit device 600 may include a plurality of word line cut regions WC61, WC62, WC63, and WC64 and a plurality of unit block regions UB6A, UB6B, and UB6C that are respectively arranged one by one between the plurality of word line cut regions WC61, WC62, WC63, and WC64.

Each of the plurality of unit block regions UB6A, UB6B, and UB6C may have substantially the same configuration as the unit block region UB of the integrated circuit device 400 described with reference to FIG. 6. However, the plurality of unit block regions UB6A. UB6B, and UB6C may include string selection line structures SL6A, SL6B, and SL6C instead of the string selection line structure SL4 of the integrated circuit device 400. In FIG. 8, other configurations other than the string selection line structures SL6A, SL6B, and SL6C among the configurations of the plurality of unit block regions UB6A, UB6B, and UB6C are not illustrated.

Each of the plurality of word line cut regions WC61, WC62, WC63, and WC64 may have the same or similar configuration as the word line cut region WLC of the integrated circuit device 100 described with reference to FIGS. 1 and 2A to 2D.

Each of the string selection line structures SL6A, SL6B, and SL6C may include first and second lower string selection lines L1A and L1B, first and second intermediate string selection lines M2A and M2B, first and second upper string selection lines U3A and U3B, and first and second string selection bent lines MBA and MBB. The first and second lower string selection lines L1A and L1B, the first and second intermediate string selection lines M2A and M2B, the first and second upper string selection lines U3A and U3B, and the first and second string selection bent lines MBA and MBB may respectively have the same or similar configurations as those described with respect to the first and second lower string selection lines SL1A and SL1B, the first and second intermediate string selection lines SM2A and SM2B, the first and second upper string selection lines SU3A and SU3B, and the first and second string selection bent lines SMBA and SMBB illustrated in FIG. 6.

The cross-sectional configurations of the string selection line structures SL6A, SL6B, and SL6C in two adjacent unit block regions among the plurality of unit block regions UB6A, UB6B, and UB6C may have a mirror-image symmetrical structure with respect to the word line cut regions WC62 and WC63 located therebetween, respectively. For example, the unit block region UB6A and the unit block region UB6B may be adjacent to each other with the word line cut region WC62 therebetween, and the string selection line structure SL6A of the unit block region UB6A and the string selection line structure SL6B of the unit block region UB6B may have a mirror-image symmetrical structure with respect to the word line cut region WC62. Also, the unit block region UB6B and the unit block region UB6C may be adjacent to each other with the word line cut region WC63 therebetween, and the string selection line structure SL6B of the unit block region UB6B and the string selection line structure SL6C of the unit block region UB6C may have a mirror-image symmetrical structure with respect to the word line cut region WC63.

Similarly to the integrated circuit device 100 described with reference to FIGS. 1 and 2A to 2D, the integrated circuit devices 200, 300, 400, 500, and 600 described with reference to FIGS. 4A and 4B, FIGS. 5A to 5D, and FIGS. 6 to 8 may prevent an undesirable physical deformation such as falling or leaning of the memory stack and may increase the number of channel structures per unit area in the memory cell region, thereby improving the integration degree thereof.

FIGS. 9A to 9J are sequential cross-sectional views for reference in describing a method of manufacturing an integrated circuit device, according to embodiments of the inventive concept. In this example, a method of manufacturing the integrated circuit device 100 illustrated in FIGS. 1 and 2A to 2D will be described as an example. FIGS. 9A to 9J schematically illustrate some configurations according to a manufacturing process in a region corresponding to the cross-section taken along the line A-A' of FIG. 1.

Figure 9A:
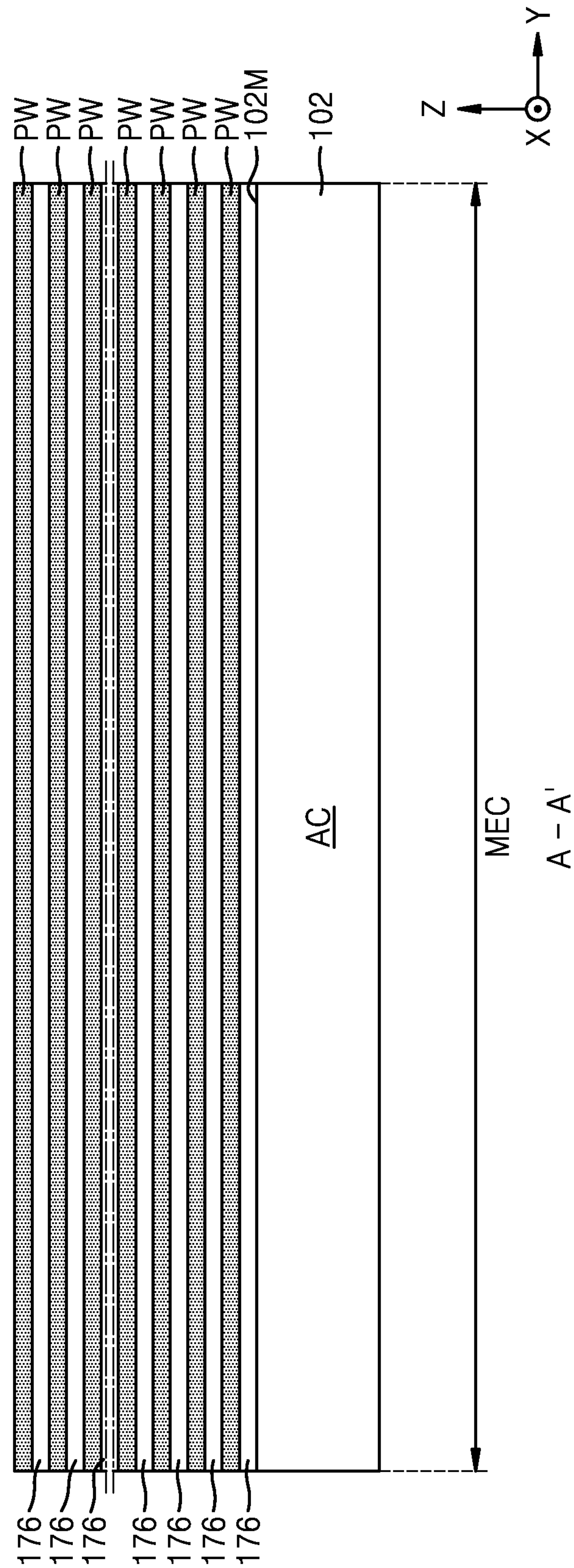
FIGS. 9A to 9J are sequential cross-sectional views for reference in describing a method of manufacturing an integrated circuit device, according to embodiments of the inventive concept.

Referring to FIG. 9A, an active region AC may be defined in a substrate 102, and then a plurality of insulating layers 176 and a plurality of sacrificial layers PW may be alternately stacked one by one on the active region AC of the substrate 102. In example embodiments, the plurality of insulating layers 176 may include a silicon oxide, and the plurality of sacrificial layers PW may include a silicon nitride or polysilicon.

Figure 9B:
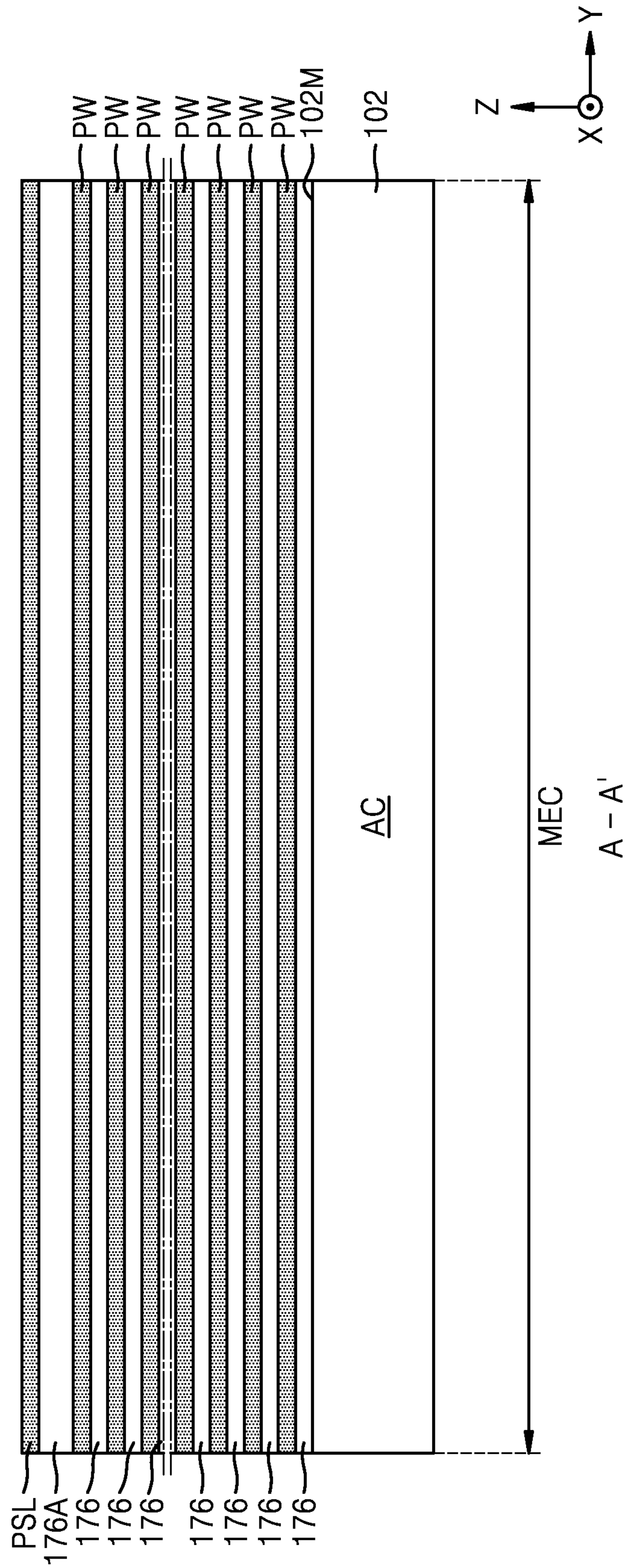

Referring to FIG. 9B, a first insulating layer 176A covering the sacrificial layer PW uppermost among the plurality of sacrificial layers PW may be formed, and then a lower sacrificial layer PSL may be formed on the first insulating layer 176A. The first insulating layer 176A may have the same configuration as the insulating layer 176 described with reference to FIG. 9A. The thickness of the first insulating layer 176A may be greater than the thickness of the insulating layer 176; however, the inventive concept is not limited thereto. The lower sacrificial layer PSL may include the same material as the plurality of sacrificial layers PW.

Figure 9C:
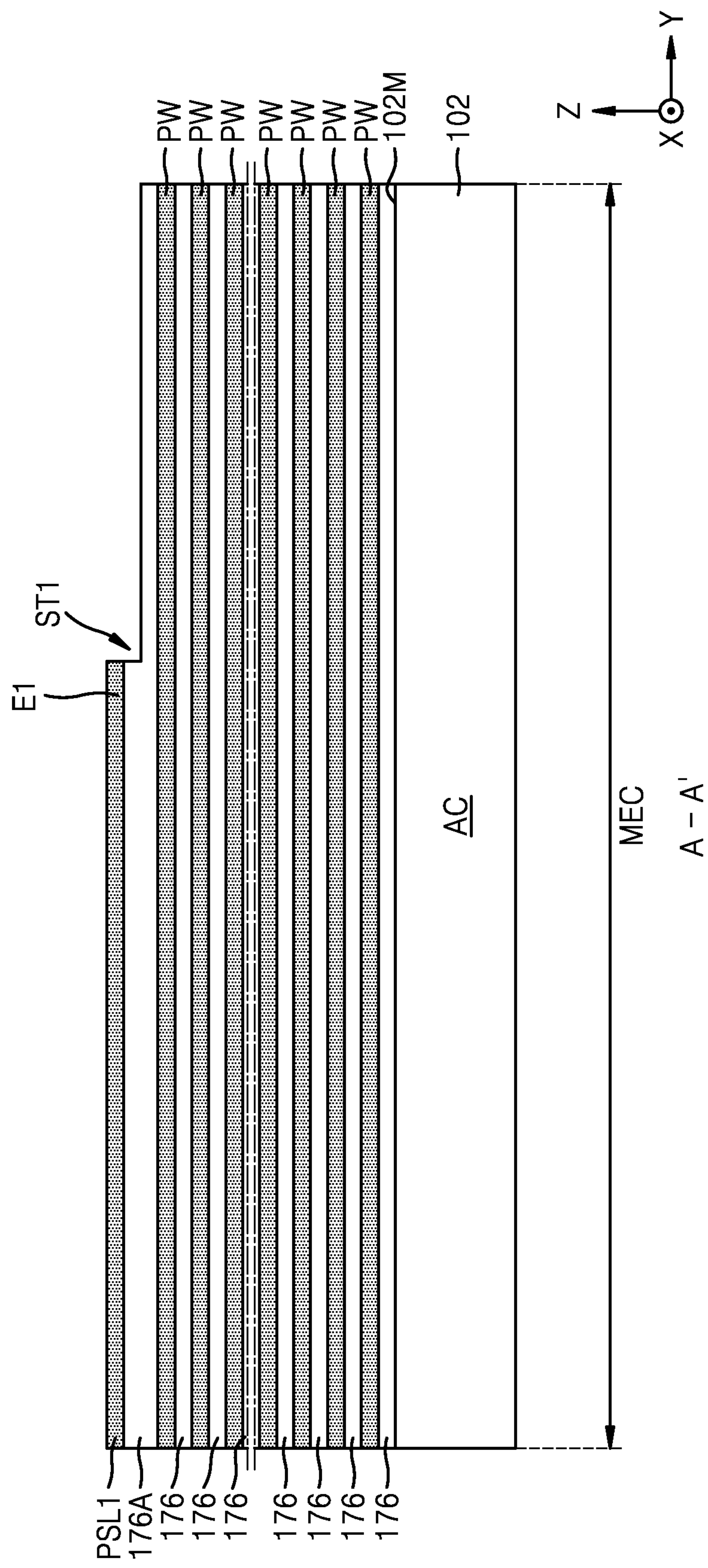

Referring to FIG. 9C, a portion of the lower sacrificial layer PSL may be removed by using a selective etching process using the etch selectivity difference between the lower sacrificial layer PSL and the first insulating layer 176A.

In the process of etching the lower sacrificial layer PSL for forming a lower sacrificial pattern PSL1, the first insulating layer 176A exposed around the lower sacrificial pattern PSL1 by over-etching may be consumed by a partial thickness from an upper surface thereof, and as a result, a step portion ST1 may be formed at the top surface of the first insulating layer 176A near an edge portion E1 of the lower sacrificial pattern PSL1.

Figure 9D:
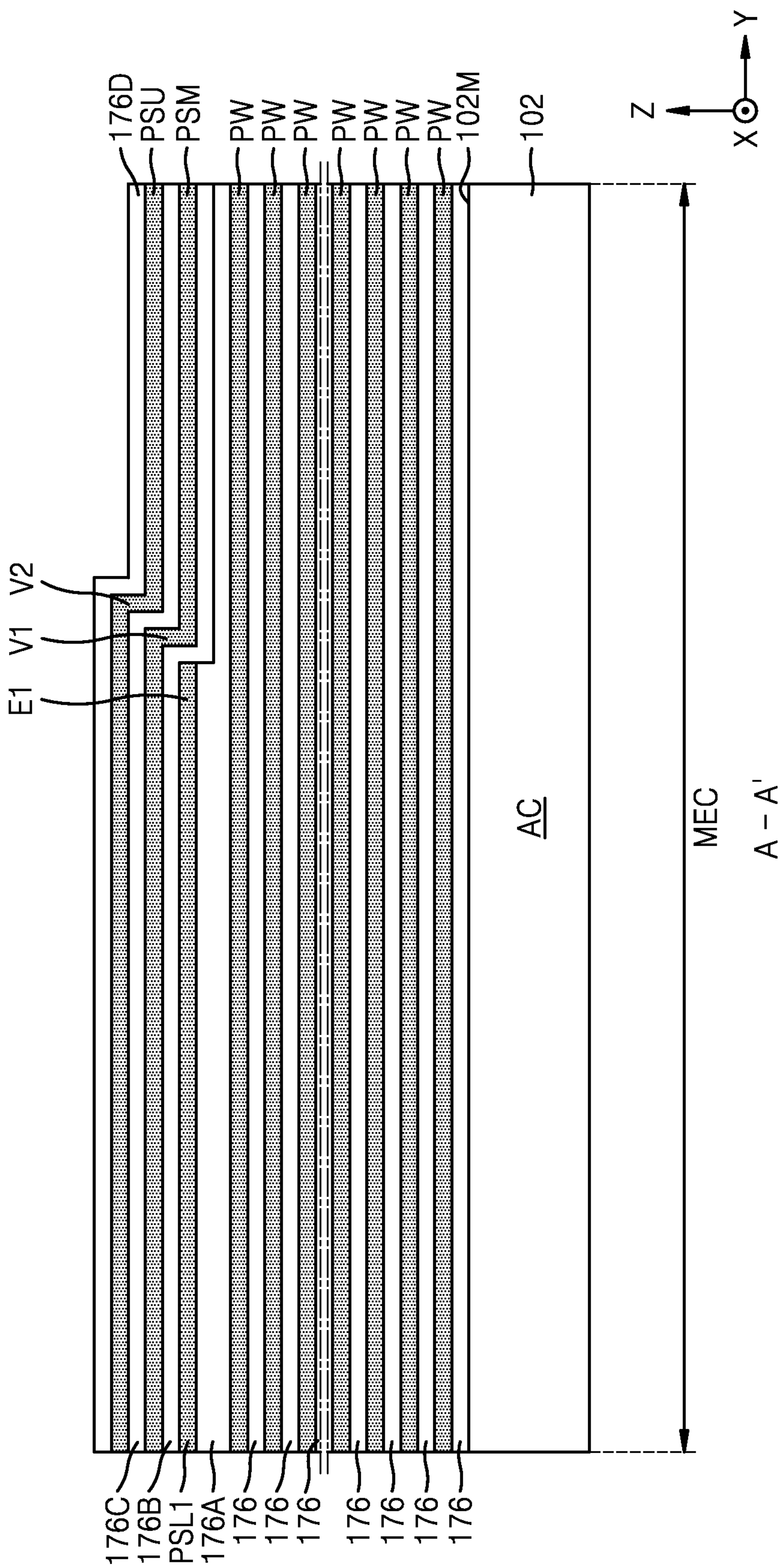

Referring to FIG. 9D, a second insulating layer 176B, an intermediate sacrificial layer PSM, a third insulating layer 176C, an upper sacrificial layer PSU, and a fourth insulating layer 176D may be sequentially formed on the resulting structure of FIG. 9C.

In each of the second insulating layer 176B, the intermediate sacrificial layer PSM, the third insulating layer 176C, the upper sacrificial layer PSU, and the fourth insulating layer 176D, a bent portion may be formed at a position adjacent to the edge portion E1 of the lower sacrificial pattern PSL1. At a position adjacent to the edge portion E1, the intermediate sacrificial layer PSM may include a vertical extension portion V1 and the upper sacrificial layer PSU may include a vertical extension portion V2. The second to fourth insulating layers 176B, 176C, and 176D may have the same configuration as the insulating layer 176 described with reference to FIG. 9A. The intermediate sacrificial layer PSM and the upper sacrificial layer PSU may have the same configuration as the plurality of sacrificial layers PW described with reference to FIG. 9A.

Figure 9E:
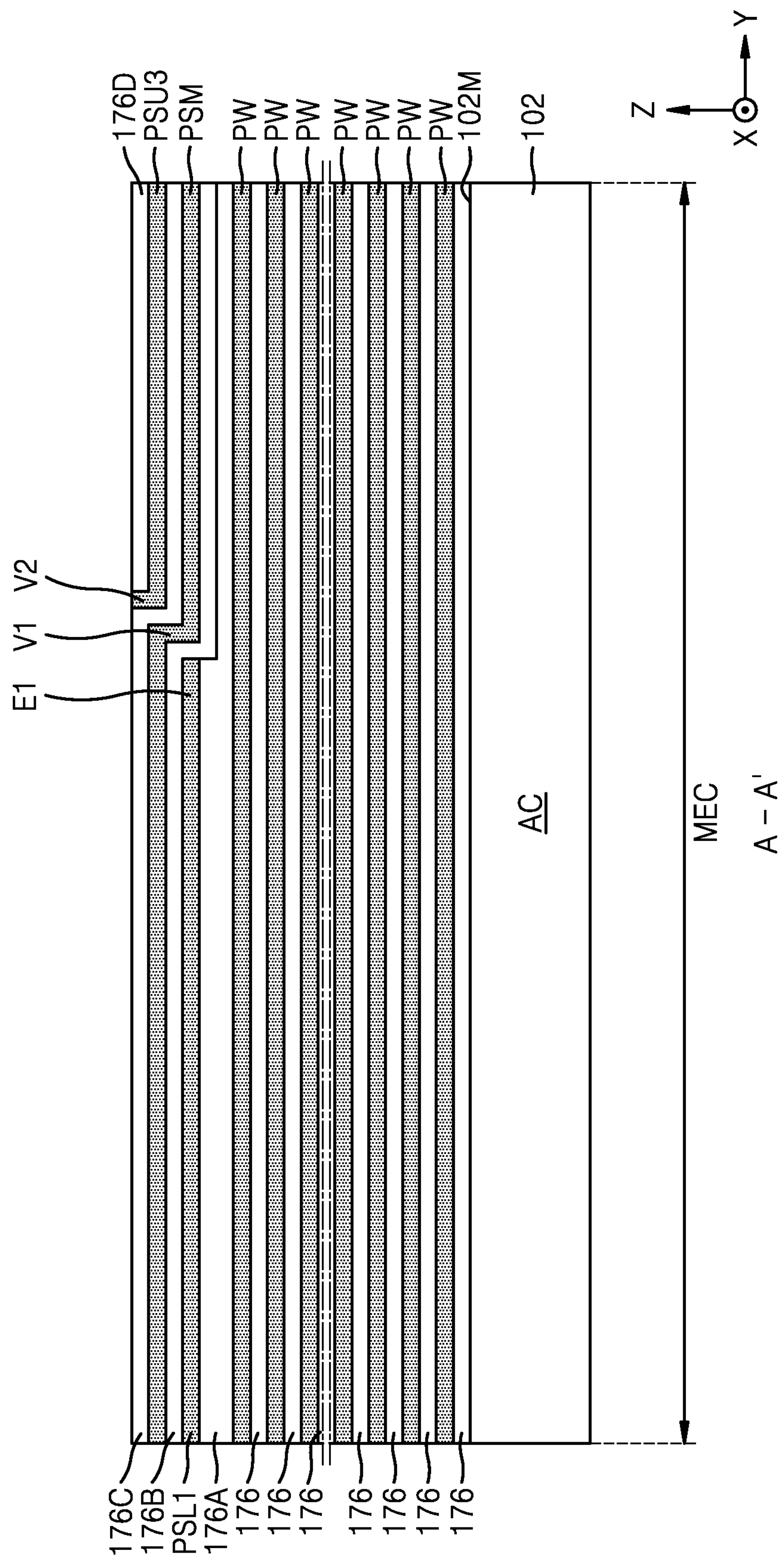

Referring to FIG. 9E, a portion of the fourth insulating layer 176D and a portion of the upper sacrificial layer PSU may be removed by performing a chemical mechanical polishing (CMP) process on the resulting structure of FIG. 9D until a portion of the third insulating layer 176C covering the intermediate sacrificial layer PSM is exposed. As a result, an upper sacrificial pattern PSU3 including the remaining portion of the upper sacrificial layer PSU may be formed.

The upper sacrificial pattern PSU3 may not overlap the lower sacrificial pattern PSL1 in the vertical direction (Z direction). At least a portion of the vertical extension portion V2 may remain in a portion near the edge portion E1 of the lower sacrificial pattern PSL1 among the upper sacrificial pattern PSU3. A portion of the fourth insulating layer 176D may remain on the upper sacrificial pattern PSU3.

Figure 9F:
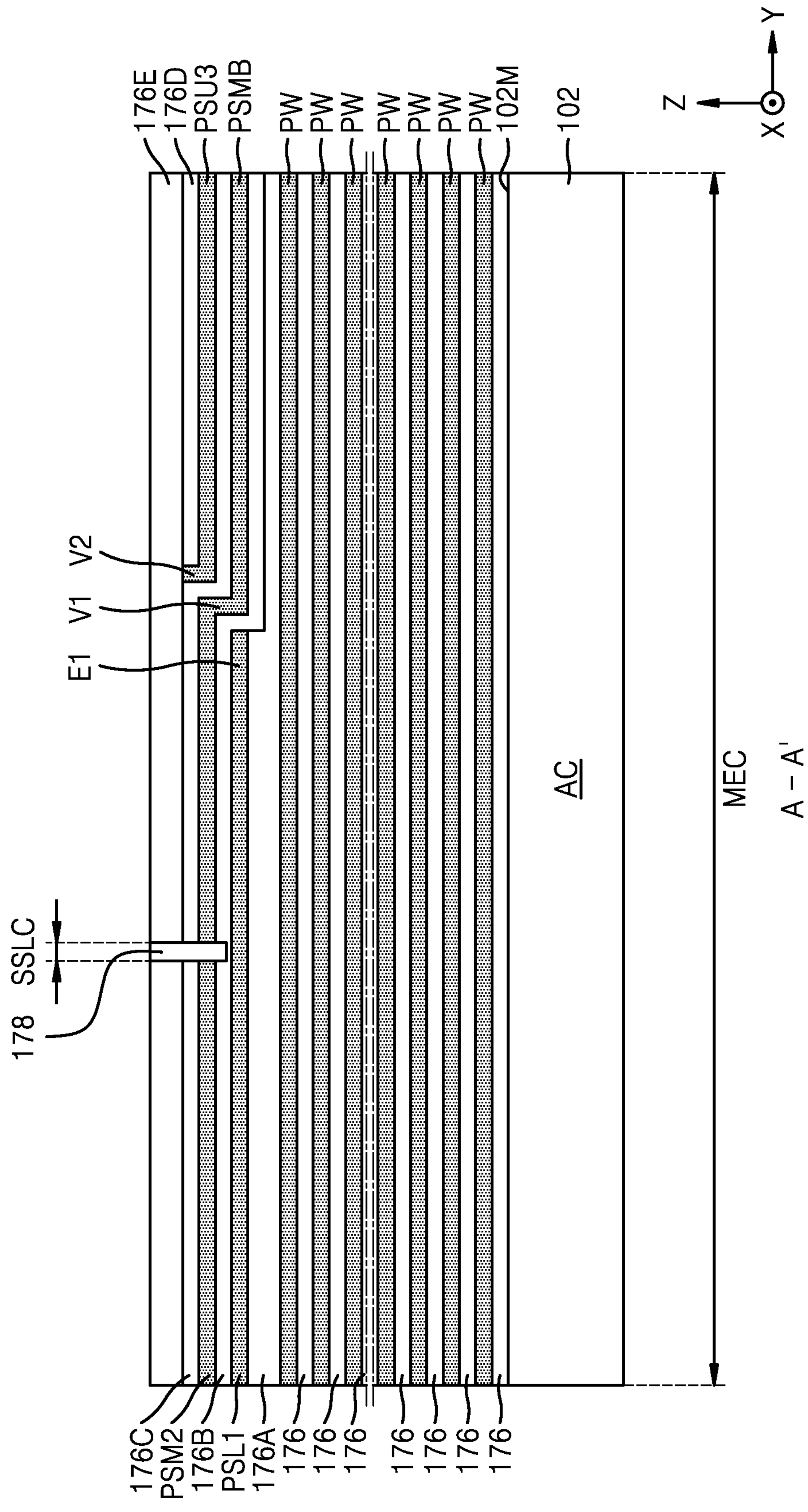

Referring to FIG. 9F, a fifth insulating layer 176E may be formed on the resulting structure of FIG. 9E, and then, by etching a portion of each of the fifth insulating layer 176E, the third insulating layer 176C, and the intermediate sacrificial layer PSM by using an etch mask (not illustrated), a string selection line cut region SSLC may be formed, and an isolation insulating layer 178 filling the string selection line cut region SSLC may be formed.

During the forming of the string selection line cut region SSLC, a portion of the second insulating layer 176B may be removed by over-etching of the intermediate sacrificial layer PSM, and after the forming of the string selection line cut region SSLC, the second insulating layer 176B may be exposed through the string selection line cut region SSLC.

After the string selection line cut region SSLC is formed, the intermediate sacrificial layer PSM may be separated into an intermediate sacrificial pattern PSM2 and a bent sacrificial pattern PSMB spaced apart from each other by the string selection line cut region SSLC. The bent sacrificial pattern PSMB may include a vertical extension portion V1.

Figure 9G:
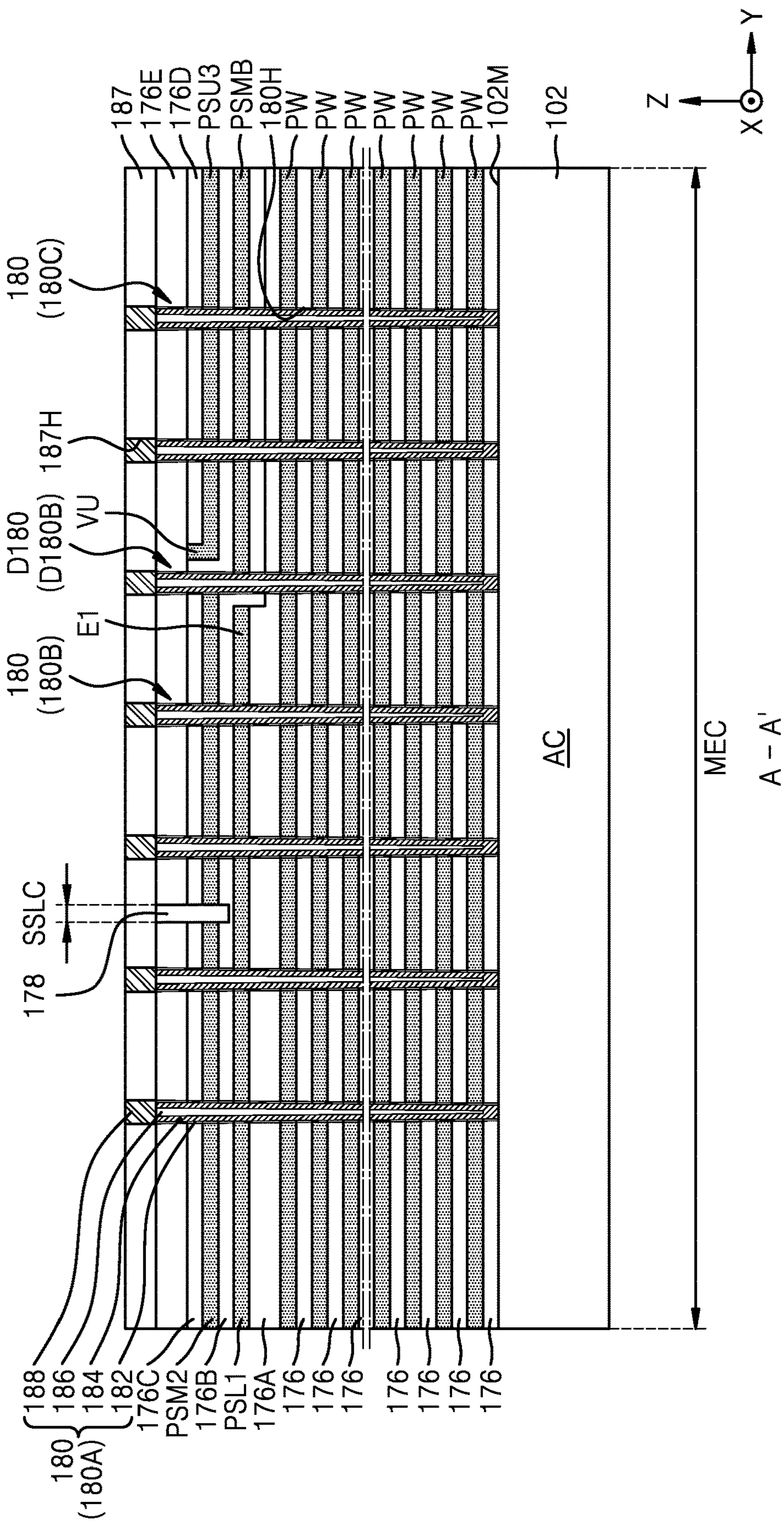

Referring to FIG. 9G, a plurality of channel holes 180H, which pass through the plurality of insulating layers 176, the first to fifth insulating layers 176A, 176B, 176C, 176D, and 176E, the plurality of sacrificial layers PW, and the lower sacrificial pattern PSL1, the intermediate sacrificial pattern PSM2, the upper sacrificial pattern PSU3, and the bent sacrificial pattern PSMB and extend in the vertical direction (Z direction), may be formed in the resulting structure of FIG. 9F, and then a gate dielectric layer 182, a channel region 184, and a buried insulating layer 186 may be formed in each of the channel holes 180H. Subsequently, an upper insulating layer 187 covering the upper surface of each of the gate dielectric layer 182, the channel region 184, and the buried insulating layer 186 and the upper surface of the fifth insulating layer 176E may be formed and a plurality of contact holes 187H exposing the top surfaces of the channel region 184 and the buried insulating layer 186 may be formed in the upper insulating layer 187, and then a plurality of drain regions 188 may be formed in the plurality of contact holes 187H to form a plurality of channel structures 180 and a plurality of dummy channel structures D180.

The plurality of channel structures 180 may include a plurality of first channel structures 180A passing through the lower sacrificial pattern PSL1 and the intermediate sacrificial pattern PSM2, a plurality of second channel structures 180B passing through the lower sacrificial pattern PSL1 and the bent sacrificial pattern PSMB, and a plurality of third channel structures 180C passing through the bent sacrificial pattern PSMB and the upper sacrificial pattern PSU3. The plurality of dummy channel structures D180 may include a plurality of first dummy channel structures D180A (see FIGS. 1 and 2A) passing through the isolation insulating layer 178 and extending in a line in the first horizontal direction (X direction), and a plurality of second dummy channel structures D180B passing through the bent sacrificial pattern PSMB and extending in a line in the first horizontal direction (X direction). A vertical extension portion V1 (see FIG. 9F) of the bent sacrificial pattern PSMB may remain between the plurality of second dummy channel structures D180B.

The gate dielectric layer 182 may be formed to cover the inner sidewall of each of the plurality of channel holes 180H. Each of the gate dielectric layer 182, the channel region 184, and the buried insulating layer 186 may be formed by a chemical vapor deposition (CVD) process, a low pressure CVD (LPCVD) process, or an atomic layer deposition (ALD) process. In example embodiments, the channel region 184 may be formed to contact the substrate 102 exposed to the bottom portion of the channel hole 180H. In other example embodiments, a semiconductor layer (not illustrated) formed by a selective epitaxial growth process may be formed on the substrate 102 exposed to the bottom portion of the channel hole 180H, and the channel region 184 may be formed on the semiconductor layer.

Figure 9H:
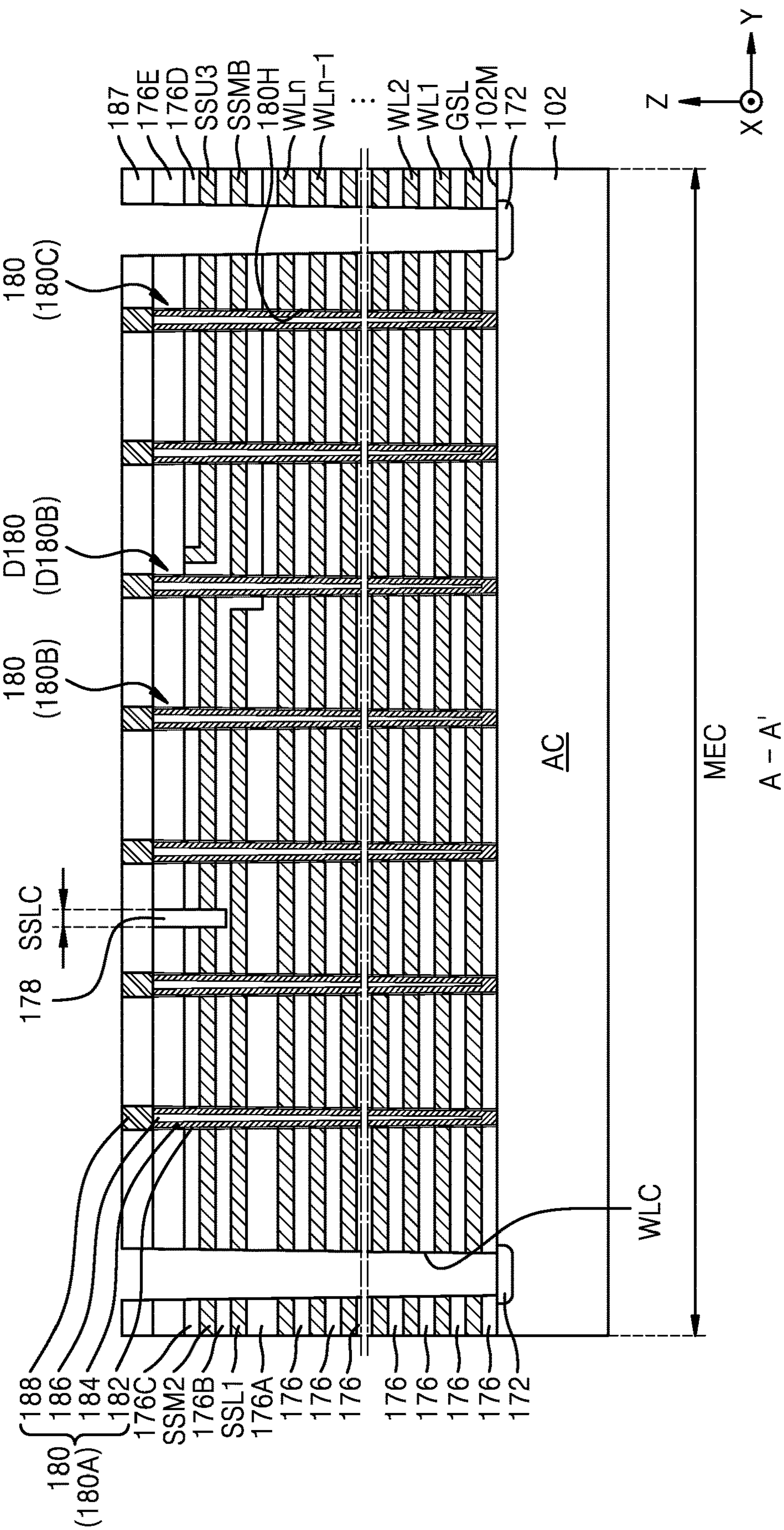

Referring to FIG. 9H, a plurality of word line cut regions WLC, which pass through the plurality of insulating layers 176, the first to fifth insulating layers 176A, 176B, 176C, 176D, and 176E, the upper insulating layer 187, the plurality of sacrificial layers PW, the lower sacrificial pattern PSL1, the intermediate sacrificial pattern PSM2, the upper sacrificial pattern PSU3, and the bent sacrificial pattern PSMB, extend in the vertical direction (Z direction), and have a bottom portion exposing the substrate 102, may be formed in the resulting structure of FIG. 9G, and then a plurality of common source regions 172 may be formed by implanting impurity ions into the substrate 102 through the plurality of word line cut regions WLC.

Thereafter, the plurality of sacrificial layers PW, the lower sacrificial pattern PSL1, the intermediate sacrificial pattern PSM2, the upper sacrificial pattern PSU3, and the bent sacrificial pattern PSMB (see FIG. 9G) may be substituted with a ground selection line GSL, a plurality of word lines WL1, WL2, . . . , WLn−1, and WLn, and a string selection line structure SL1. The string selection line structure SL1 may include a lower string selection line SSL1, an intermediate string selection line SSM2, an upper string selection line SSU3, and a string selection bent line SSMB.

In example embodiments, in order to form the ground selection line GSL, the plurality of word lines WL1, WL2, . . . , WLn−1, and WLn, and the string selection line structure SL1, empty spaces may be formed by selectively removing the plurality of sacrificial layers PW, the lower sacrificial pattern PSL1, the intermediate sacrificial pattern PSM2, the upper sacrificial pattern PSU3, and the bent sacrificial pattern PSMB exposed through the plurality of word line cut regions WLC (see FIG. 9G), and the empty spaces may be filled with a conductive material.

In other example embodiments, when each of the plurality of sacrificial layers PW, the lower sacrificial pattern PSL1, the intermediate sacrificial pattern PSM2, the upper sacrificial pattern PSU3, and the bent sacrificial pattern PSMB (see FIG. 9G) includes polysilicon, a polysilicon silicidation process may be performed to form the ground selection line GSL, the plurality of word lines WL1, WL2, . . . , WLn−1, and WLn, and the string selection line structure SL1. In this case, each of the ground selection line GSL, the plurality of word lines WL1, WL2, . . . , WLn−1, and WLn, and the string selection line structure SL1 may include a metal silicide.

Figure 9I:
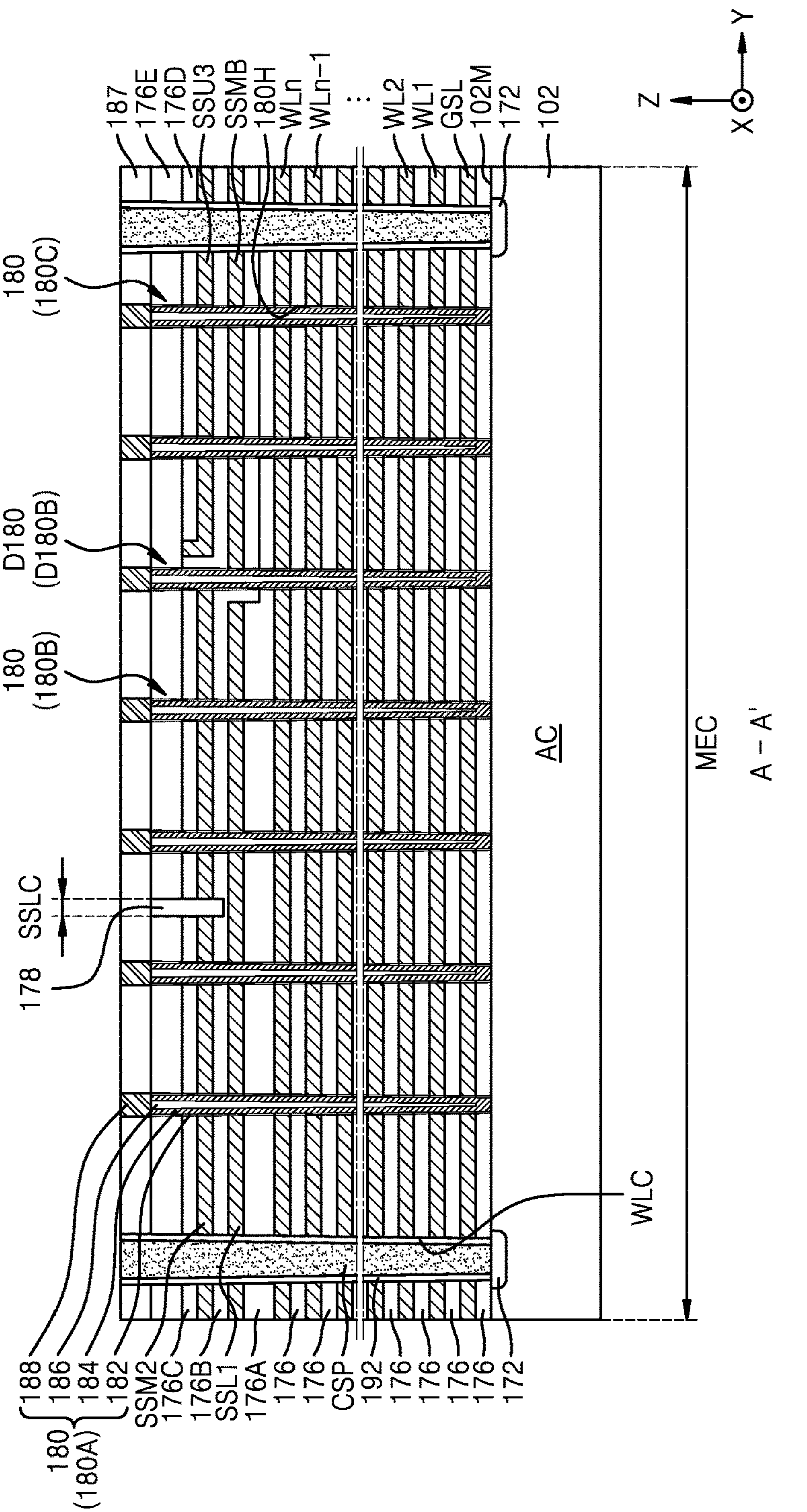

Referring to FIG. 9I, an insulating spacer 192 and a common source pattern CSP may be formed in each of the plurality of word line cut regions WLC.

In example embodiments, in order to form the insulating spacer 192, an insulating layer covering the inner wall of the plurality of word line cut regions WLC may be formed first. Thereafter, the insulating spacer 192 including a portion of the insulating layer remaining on the inner sidewalls of the plurality of word line cut regions WLC may be formed by etching back the insulating layer to expose the substrate 102 at the bottom surface of the plurality of word line cut regions WLC. In order to form the common source pattern CSP in each of the plurality of word line cut regions WLC, a space defined by the insulating spacer 192 in the plurality of word line cut regions WLC may be filled with a conductive layer. In example embodiments, a metal silicide layer (not illustrated) may be arranged between the common source region 172 and the common source pattern CSP to reduce the contact resistance thereof. For example, the metal silicide layer may include a cobalt silicide; however, the inventive concept is not limited thereto.

Figure 9J:
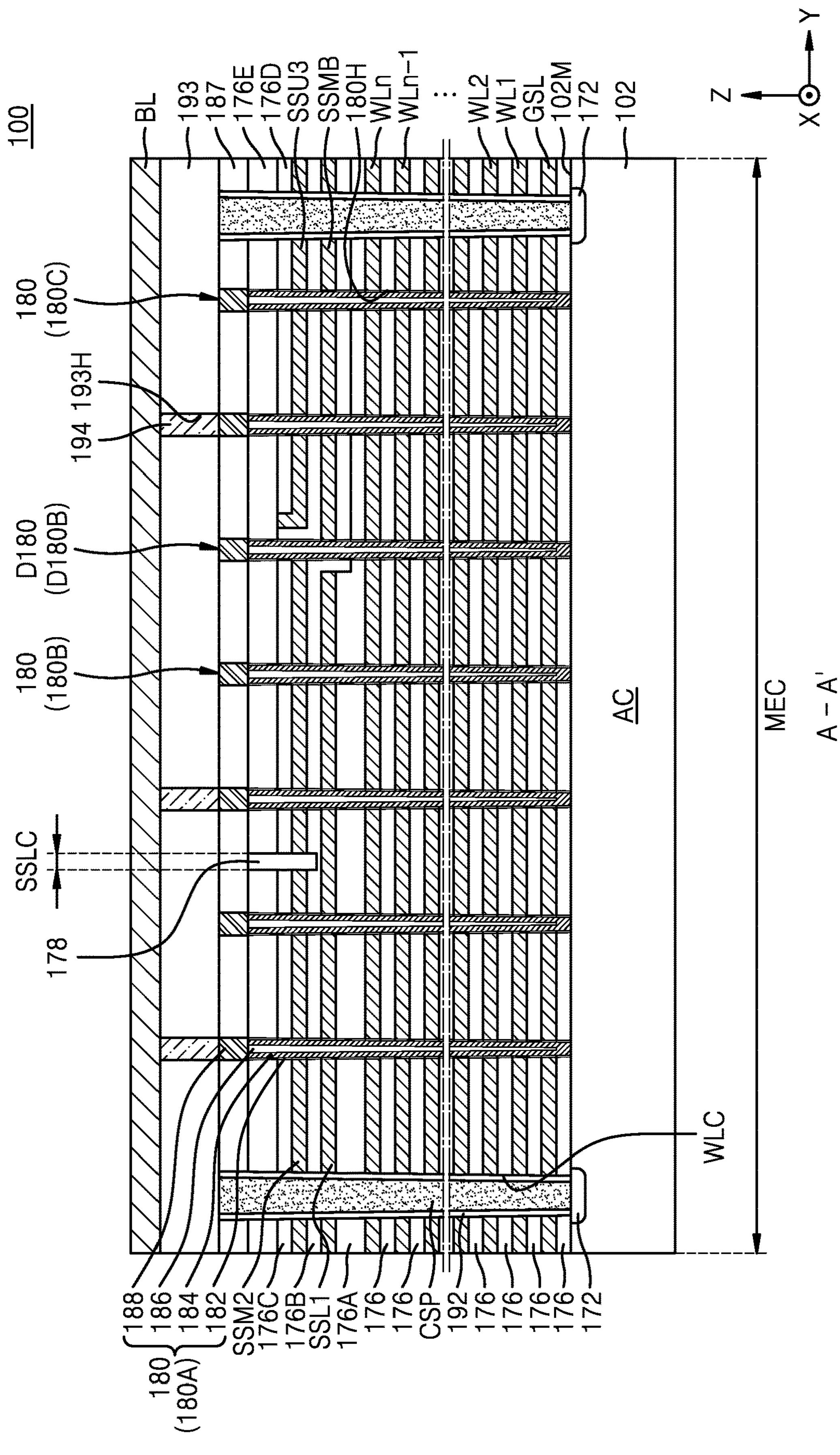

Referring to FIG. 9J, an interlayer insulating layer 193 covering the plurality of common source patterns CSP, the plurality of channel structures 180, and the plurality of dummy channel structures D180 may be formed, and then a plurality of contact holes 193H passing through some regions of the interlayer insulating layer 193 to expose the drain regions 188 of the plurality of channel structures 180 may be formed and a plurality of contact plugs 194 may be formed by filling the plurality of contact holes 193H with a conductive material. Thereafter, a plurality of bit lines BL may be formed on the interlayer insulating layer 193 and the plurality of contact plugs 194 to manufacture the integrated circuit device 100.

Figure 10A:
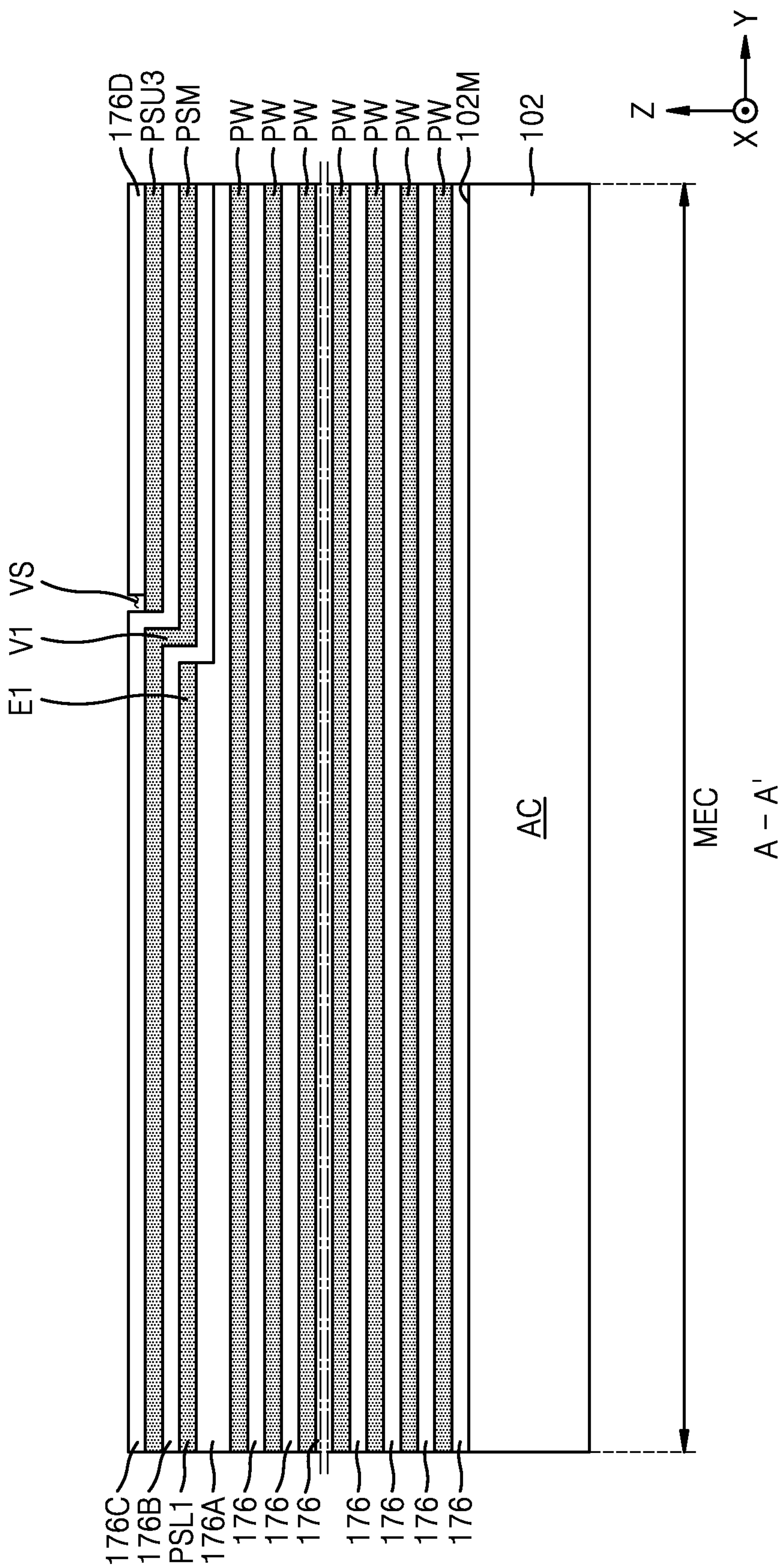
FIGS. 10A and 10B are sequential cross-sectional views for reference in describing a method of manufacturing an integrated circuit device, according to other embodiments of the inventive concept.
Figure 10B:
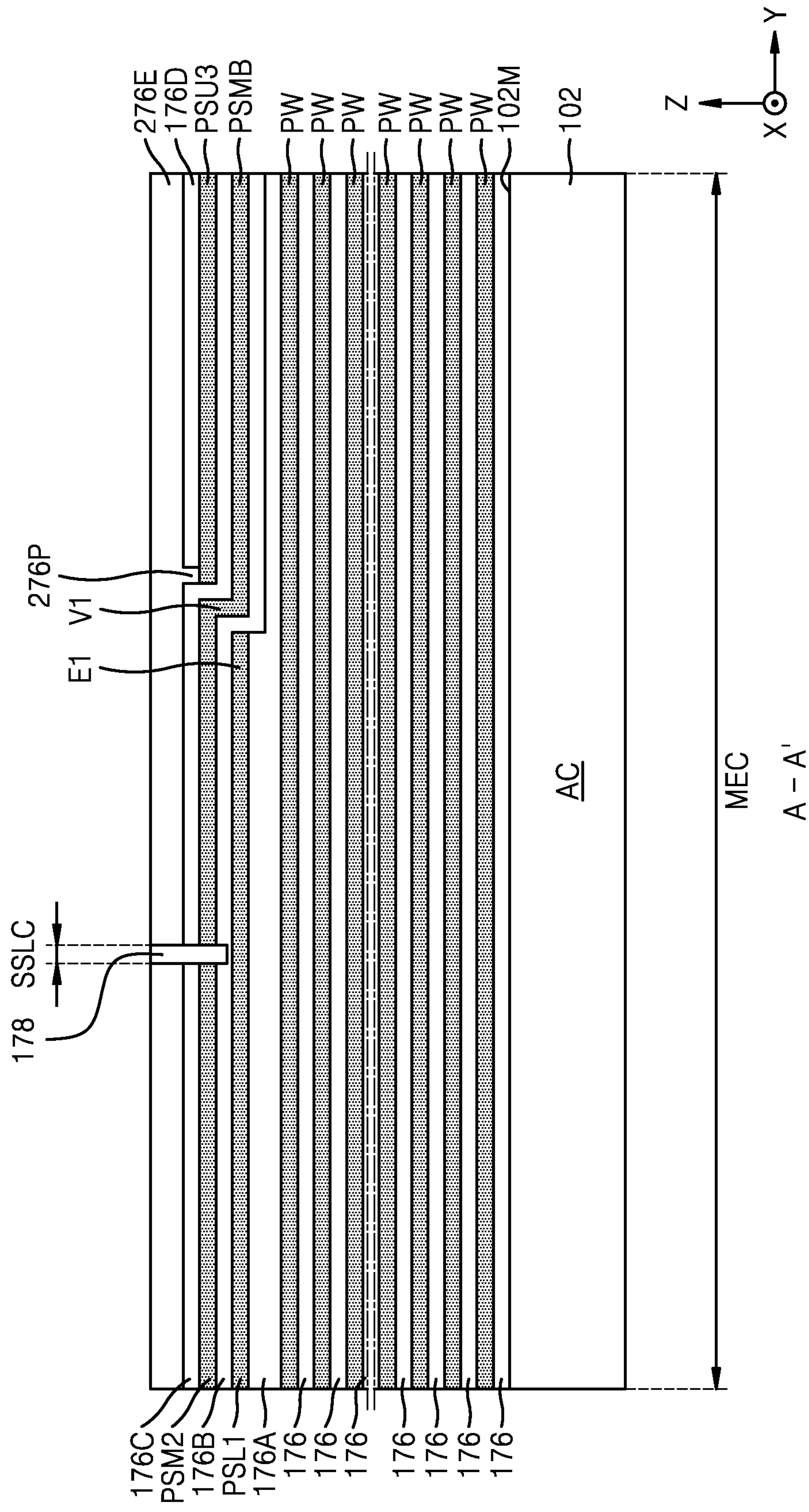

FIGS. 10A and 10B are sequential cross-sectional views for reference in describing a method of manufacturing an integrated circuit device, according to other embodiments of the inventive concept. In this example, a method of manufacturing the integrated circuit device 200 illustrated in FIGS. 4A and 4B will be described as an example. In FIGS. 10A and 10B, the same reference numerals as in FIGS. 9A to 9J denote the same elements, and redundant descriptions thereof will be omitted for conciseness.

Referring to FIG. 10A, after performing the processes described with reference to FIGS. 9A to 9D, in the same way as described with reference to FIG. 9E, a CMP process may be performed on the resulting structure of FIG. 9D until a portion of the third insulating layer 176C covering the intermediate sacrificial layer PSM is exposed. However, in the present example, during or after the CMP process, a portion of the fourth insulating layer 176D and a portion of the upper sacrificial layer PSU may be removed by using an etching atmosphere in which the etching rate of the upper sacrificial layer PSU is higher than the etching rate of the fourth insulating layer 176D. As a result, a portion of the fourth insulating layer 176D and a portion of the upper sacrificial layer PSU may be removed to expose a portion of the third insulating layer 176C covering the intermediate sacrificial layer PSM, and then an empty space VS may be formed between the third insulating layer 176C and the fourth insulating layer 176D. An upper sacrificial pattern PSU3, which is the remaining portion of the upper sacrificial layer PSU, may be exposed through the empty space VS. The upper sacrificial pattern PSU3 may not include a vertical extension portion V2 (see FIG. 9E).

Referring to FIG. 10B, a fifth insulating layer 276E may be formed on the resulting structure of FIG. 10A by a method similar to that described with reference to FIG. 9F with respect to the process of forming the fifth insulating layer 176E. The fifth insulating layer 276E may include an insulating protrusion portion 276P filling the empty space VS (see FIG. 10A) between the third insulating layer 176C and the fourth insulating layer 176D. The fifth insulating layer 276E may include a silicon oxide layer.

Thereafter, a string selection line cut region SSLC and an isolation insulating layer 178 may be formed as described with reference to FIG. 9F, and the processes described with reference to FIGS. 9G to 9J may be performed to manufacture the integrated circuit device 200 illustrated in FIGS. 4A and 4B.

Figure 11A:
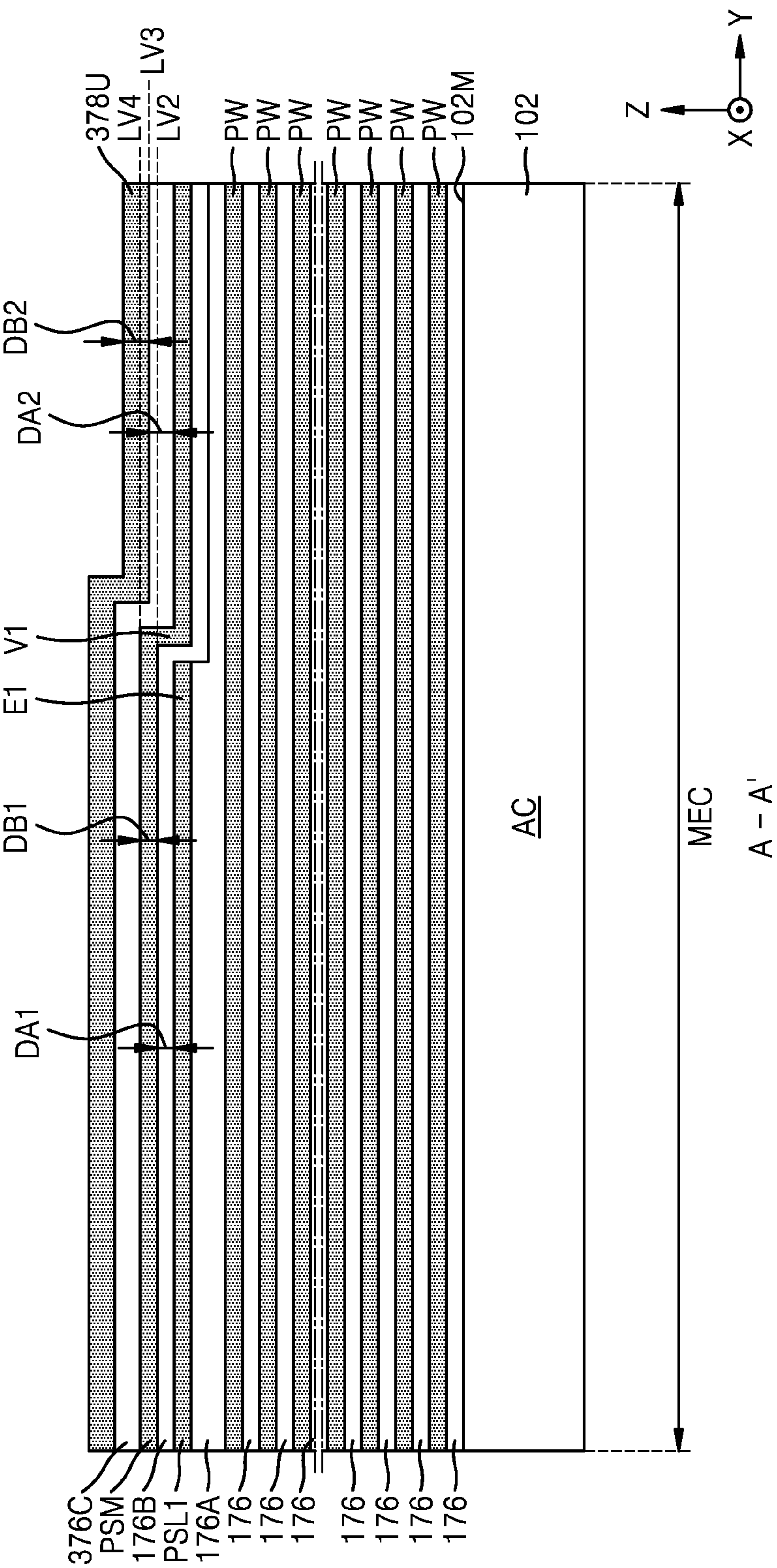
FIGS. 11A to 11C are sequential cross-sectional views for reference in describing a method of manufacturing an integrated circuit device, according to other embodiments of the inventive concept.
Figure 11B:
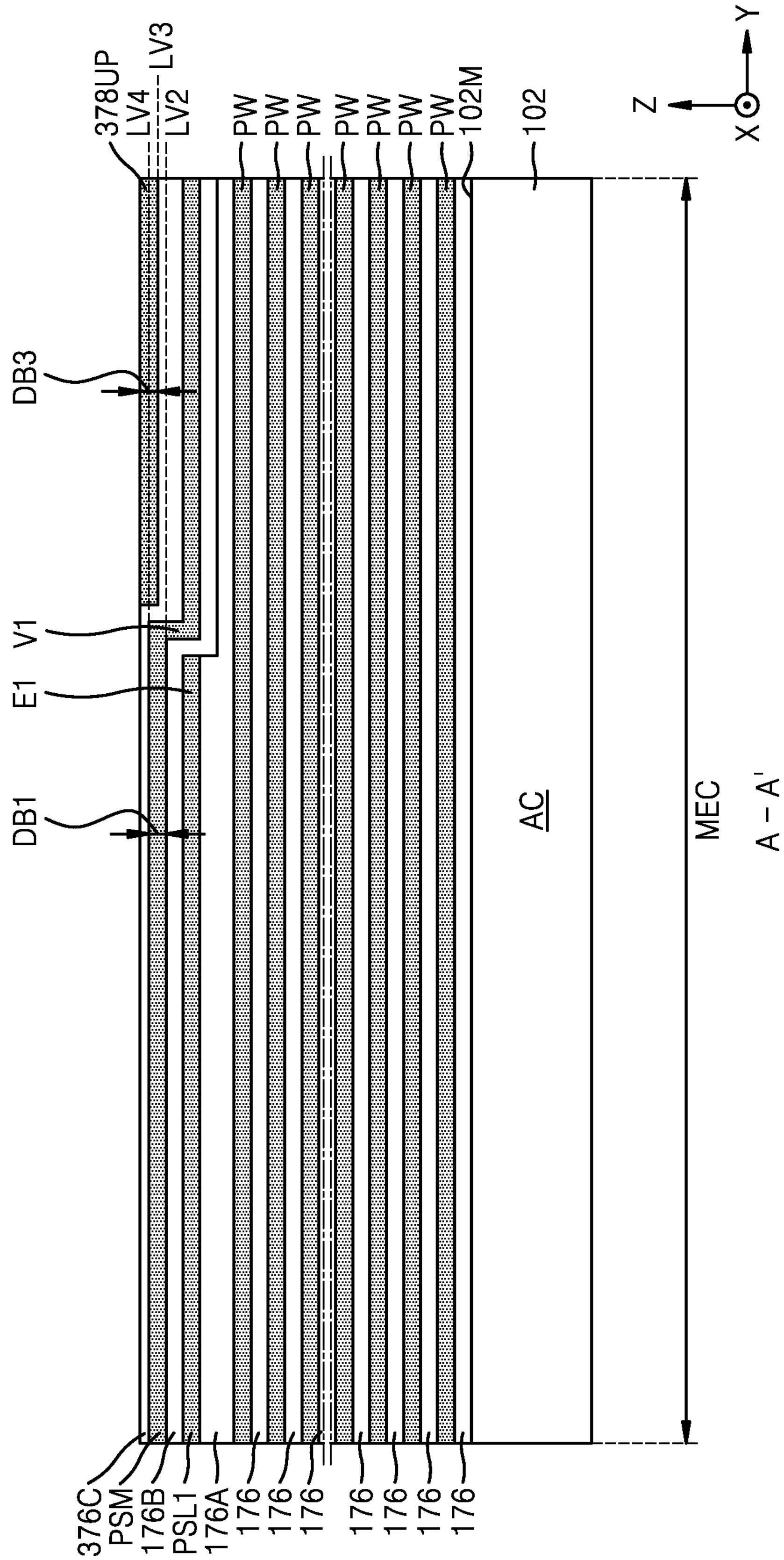
Figure 11C:
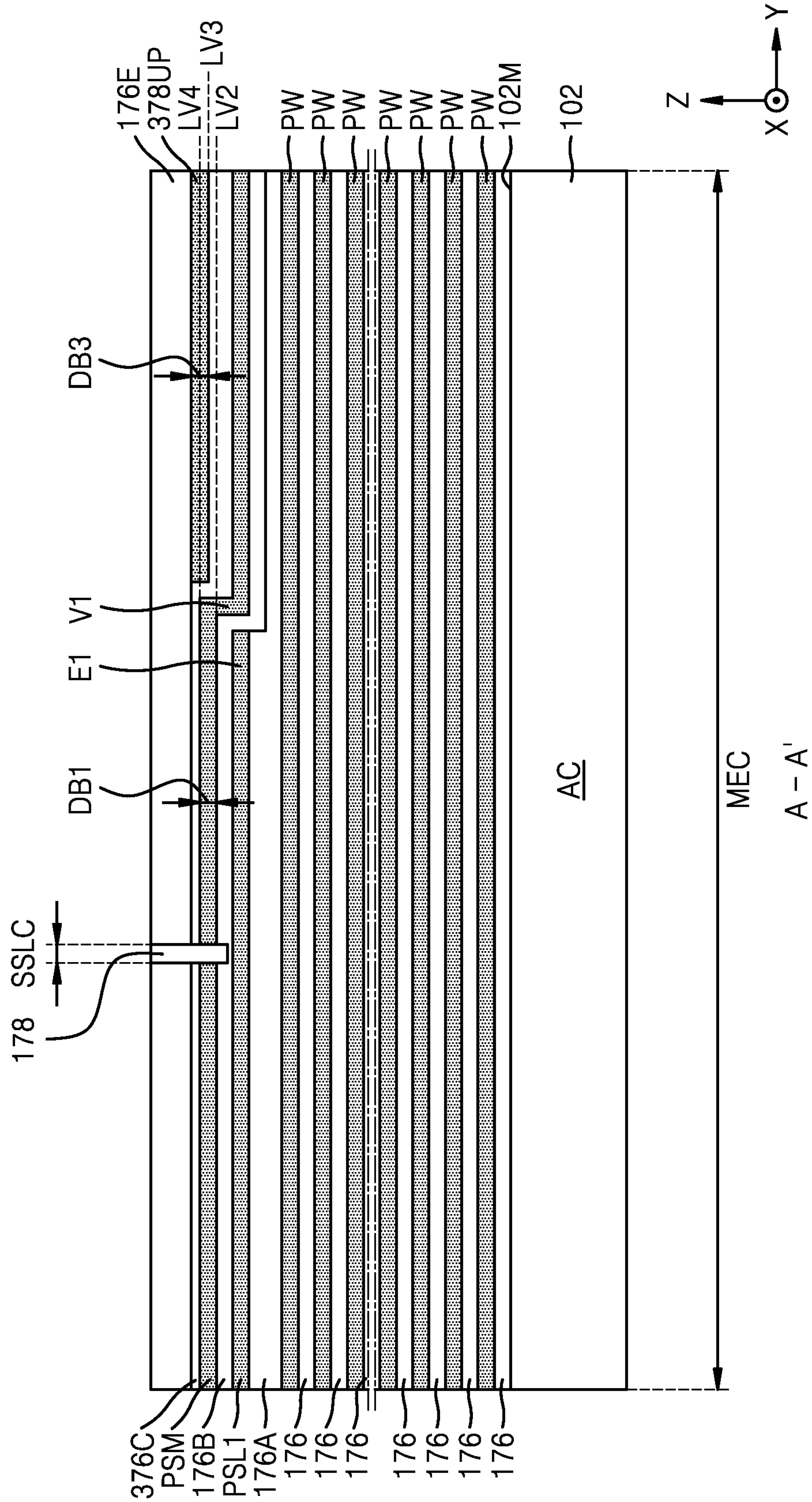

FIGS. 11A to 11C are sequential cross-sectional views for reference in describing a method of manufacturing an integrated circuit device, according to other embodiments of the inventive concept. In this example, a method of manufacturing the integrated circuit device 300 illustrated in FIGS. 5A and 5B will be described as an example. In FIGS. 11A to 11C, the same reference numerals as in FIGS. 9A to 9J denote the same elements, and redundant descriptions thereof will be omitted for conciseness.

Referring to FIG. 11A, after performing the processes described with reference to FIGS. 9A to 9C, a second insulating layer 176B and an intermediate sacrificial layer PSM may be formed on the resulting structure of FIG. 9C. Thereafter, a third insulating layer 376C and an upper sacrificial layer 378U may be sequentially formed on the intermediate sacrificial layer PSM. A thickness DA2 of the third insulating layer 376C may be greater than a thickness DA1 of the second insulating layer 176B, and a thickness DB2 of the upper sacrificial layer 378U may be greater than a thickness DB1 of the intermediate sacrificial layer PSM. In example embodiments, the bottom level of the intermediate sacrificial layer PSM may be the second level LV2. The bottom level of the upper sacrificial layer 378U may be the third level LV3 higher than the second level LV2. The top level of the intermediate sacrificial layer PSM may be a fourth level LV4 equal to or higher than the third level LV3. More detailed configurations of the third insulating layer 376C and the upper sacrificial layer 378U may be substantially the same as those described with respect to the third insulating layer 176C and the upper sacrificial layer PSU with reference to FIG. 9D.

Referring to FIG. 11B, a portion of the upper sacrificial layer 378U and a portion of the third insulating layer 376C may be removed by performing a CMP process on the resulting structure of FIG. 1I A until a portion of the third insulating layer 376C covering the lower sacrificial pattern PSL1 is exposed. An upper sacrificial pattern 378UP, which is the remaining portion of the upper sacrificial layer 378U, may be formed after the CMP process.

A thickness DB3 of the upper sacrificial pattern 378UP may be substantially equal to or similar to a thickness DB1 of the intermediate sacrificial layer PSM such that a thickness variation in the lower sacrificial pattern PSL1, the intermediate sacrificial layer PSM, and the upper sacrificial pattern 378UP may be minimized.

Referring to FIG. 11C, a fifth insulating layer 176E, a string selection line cut region SSLC, and a isolation insulating layer 178 may be formed by a method similar to that described with reference to FIG. 9F.

Thereafter, the processes described with reference to FIGS. 9G to 9J may be performed to manufacture the integrated circuit device 300 illustrated in FIGS. 5A and 5B.

FIGS. 12A to 12G are sequential cross-sectional views for reference in describing a method of manufacturing an integrated circuit device, according to other embodiments of the inventive concept. In this example, a method of manufacturing the integrated circuit device 400 illustrated in FIG. 6 will be described as an example. In FIGS. 12A to 12G, the same reference numerals as in FIGS. 9A to 9J denote the same elements, and redundant descriptions thereof will be omitted for conciseness.

Figure 12A:
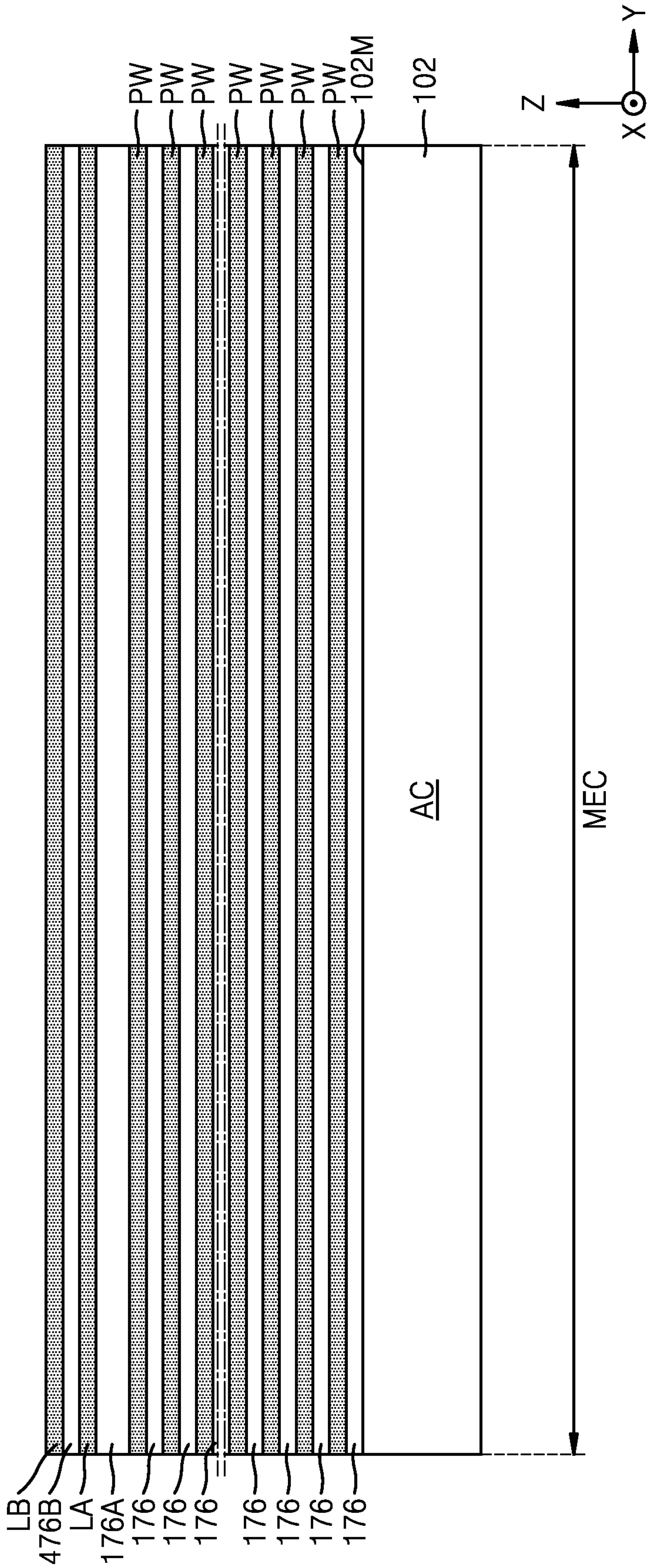
FIGS. 12A to 12G are sequential cross-sectional views for reference in describing a method of manufacturing an integrated circuit device, according to other embodiments of the inventive concept.

Referring to FIG. 12A, a plurality of insulating layers 176 and a plurality of sacrificial layers PW may be alternately stacked one by one on a substrate 102 in the same way as described with reference to FIG. 9A, and then a first insulating layer 176A may be formed in the same way as described with reference to FIG. 9B.

Thereafter, a first lower sacrificial laver LA, a second insulating layer 476B, and a second lower sacrificial layer LB may be sequentially formed on the first insulating layer 176A. The first and second lower sacrificial layers LA and LB and the second insulating layer 476B may have the same configurations as those described with respect to the plurality of sacrificial layers PW and the insulating layer 176 with reference to FIG. 9A.

Figure 12B:
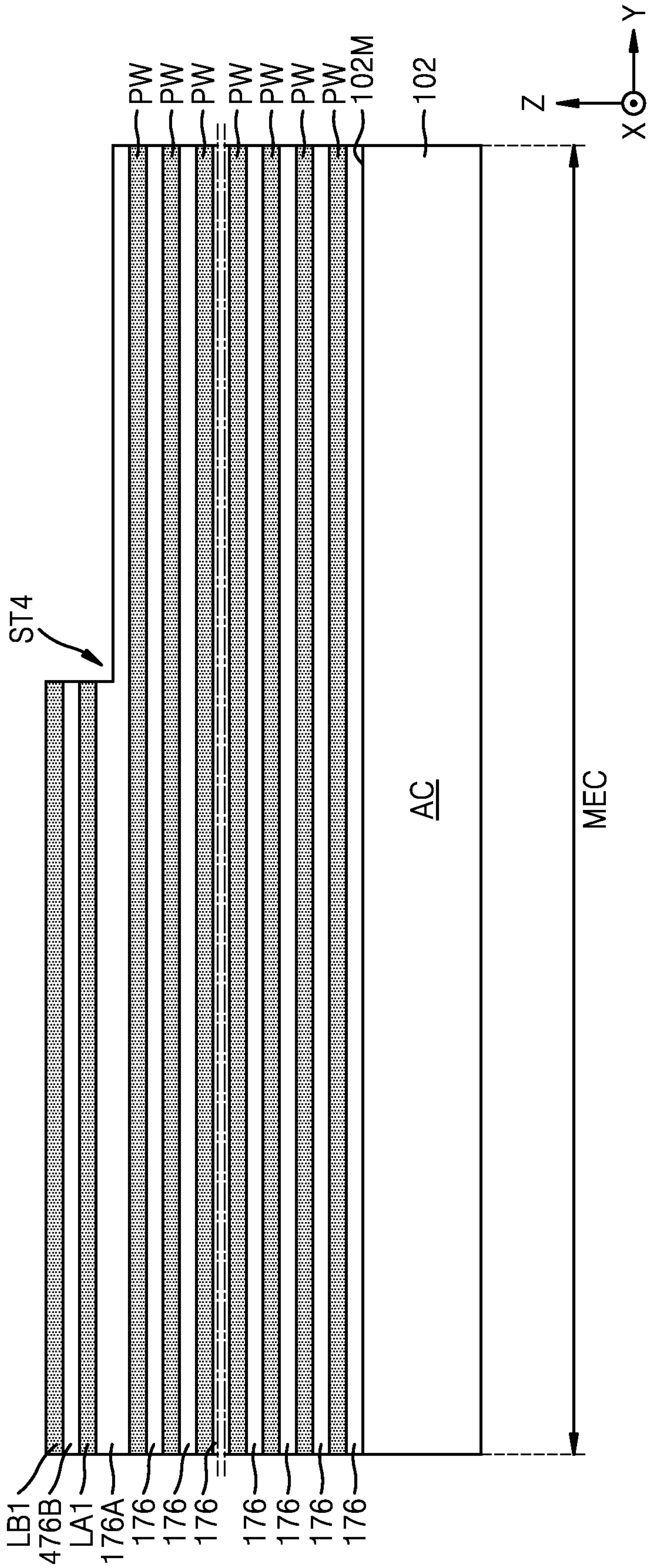

Referring to FIG. 12B, a portion of each of the first lower sacrificial layer LA, the second lower sacrificial layer LB, and the second insulating layer 476B may be removed to form a first lower sacrificial pattern LA1 and a second lower sacrificial layer LB1. A portion of the second insulating layer 476B may remain between the first lower sacrificial pattern LA1 and the second lower sacrificial pattern LB1. In this case, a portion of the first insulating layer 176A may be consumed around the first lower sacrificial pattern LA1, and as a result, a step portion ST4 may be formed at the upper surface of the first insulating layer 176A.

Figure 12C:
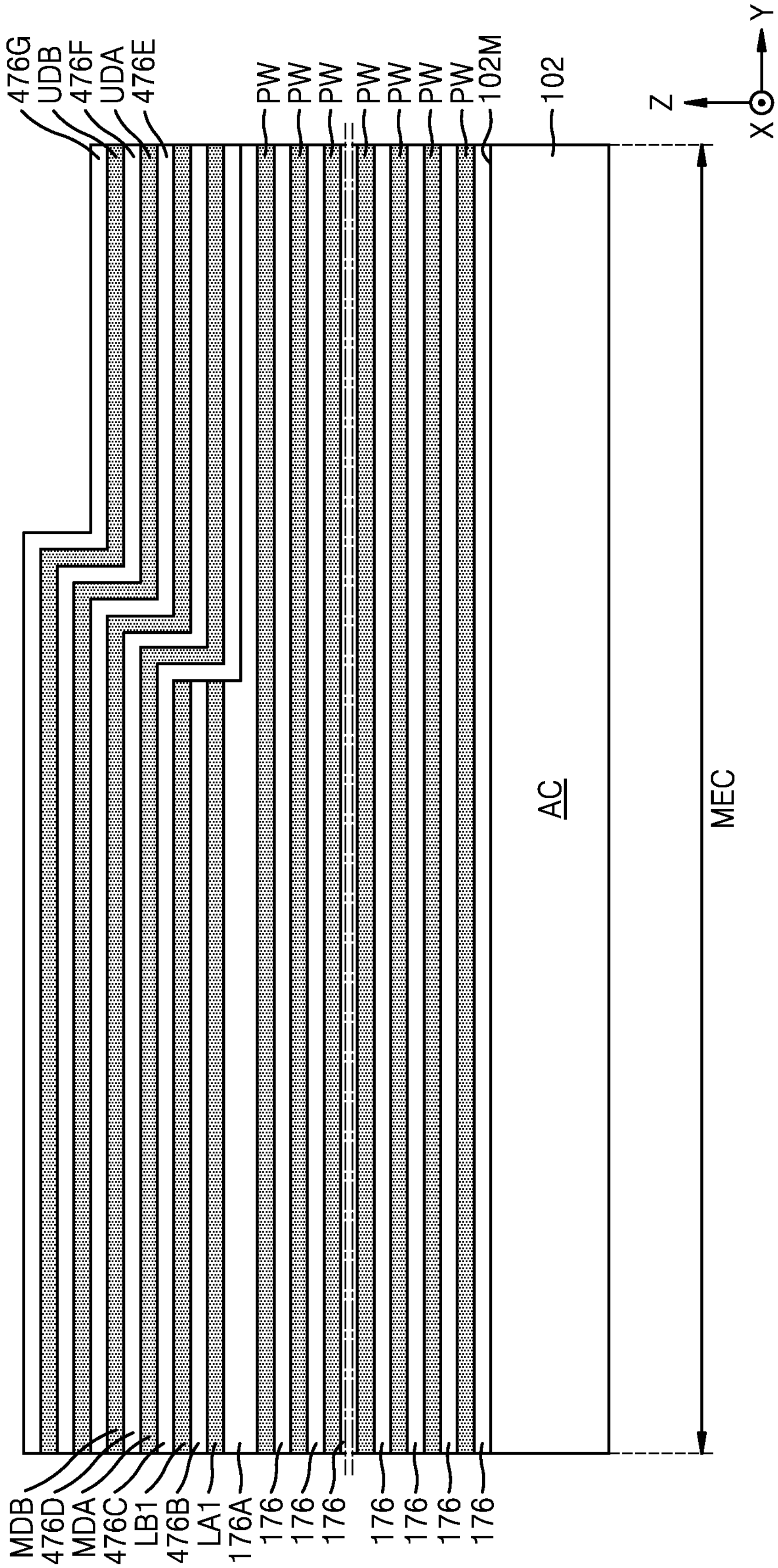

Referring to FIG. 12C, a third insulating layer 476C, a first intermediate sacrificial layer MDA, a fourth insulating layer 476D, a second intermediate sacrificial layer MDB, a fifth insulating layer 476E, a first upper sacrificial layer UDA, a sixth insulating layer 476F, a second upper sacrificial laver UDB, and a seventh insulating layer 476G may be sequentially formed on the resulting structure of FIG. 12B.

The third to seventh insulating layers 476C, 476D, 476E, 476F, and 476G may have the same configuration as the insulating layer 176 described with reference to FIG. 9A. The first intermediate sacrificial layer MDA, the second intermediate sacrificial layer MDB, the first upper sacrificial layer UDA, and the second upper sacrificial layer UDB may have the same configurations as those described with respect to the plurality of sacrificial layers PW with reference to FIG. 9A.

Figure 12D:
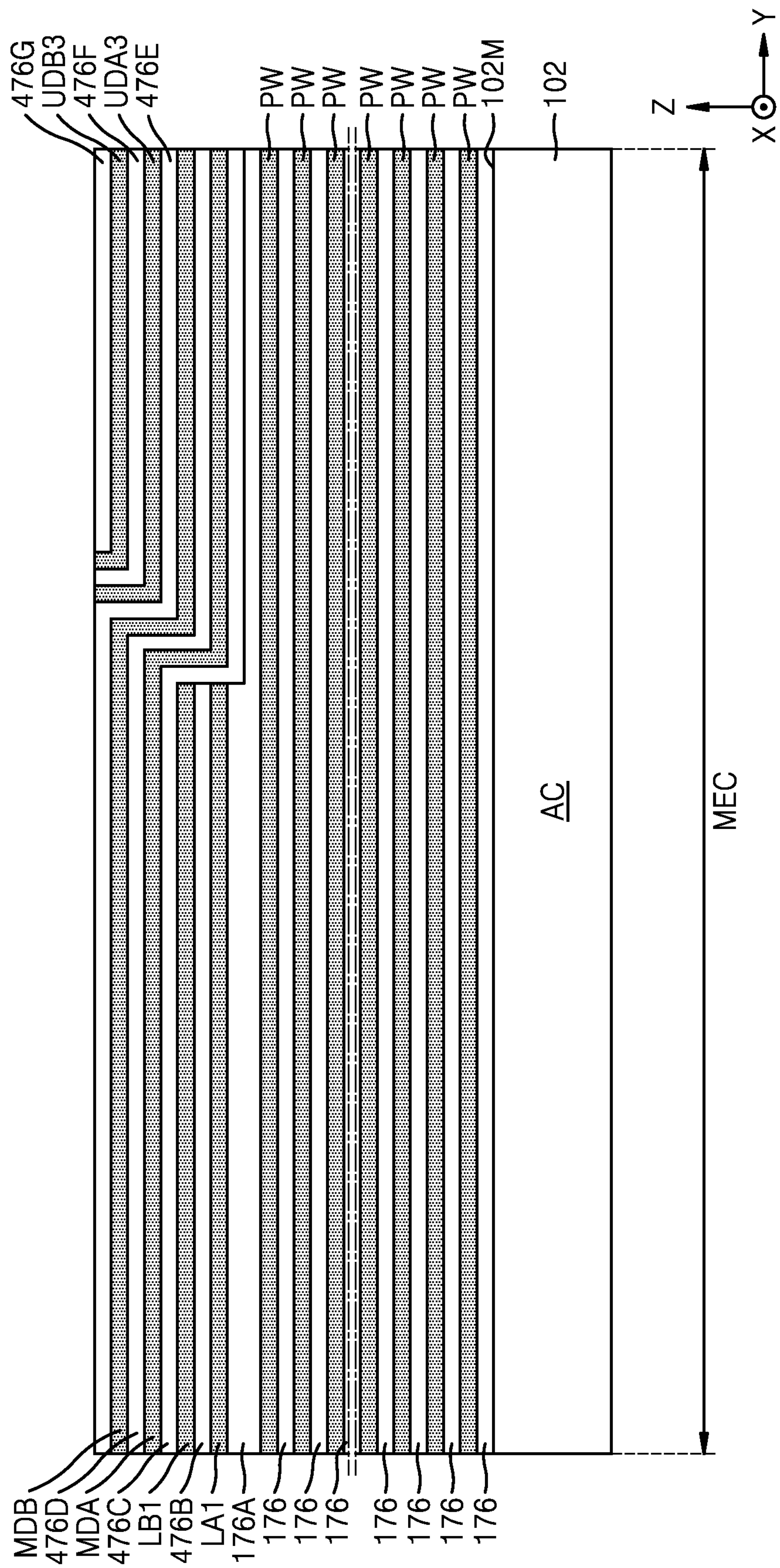

Referring to FIG. 12D, a portion of each of the sixth and seventh insulating layers 476F and 476G and the first and second upper sacrificial layers UDA and UDB may be removed by performing a CMP process on the resulting structure of FIG. 12C until a portion of the fifth insulating layer 476E covering the upper surface of the second intermediate sacrificial layer MDB is exposed. As a result, first and second upper sacrificial patterns UDA3 and UDB3 including the remaining portions of the first and second upper sacrificial layers UDA and UDB may be formed.

Figure 12E:
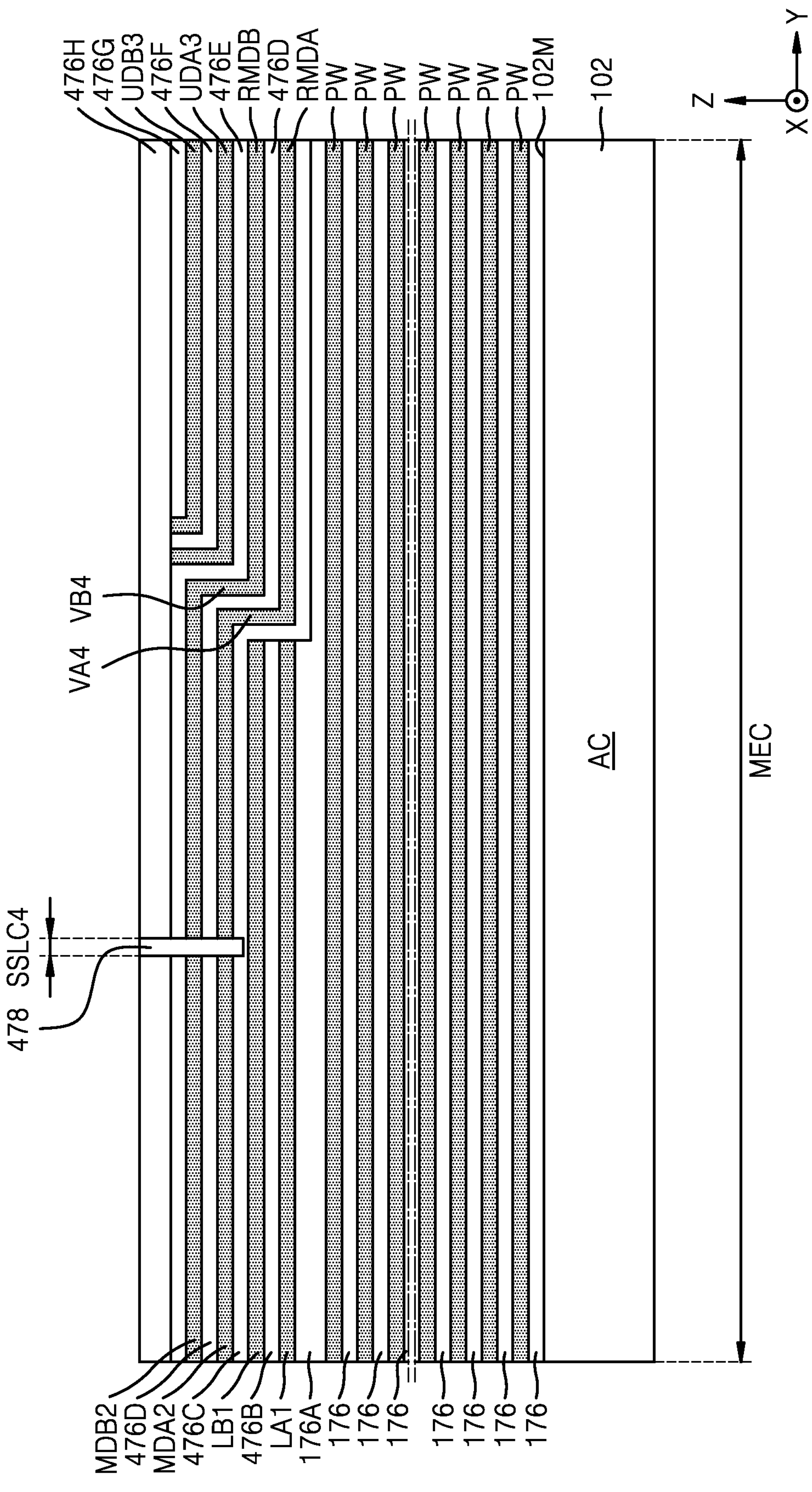

Referring to FIG. 12E, an eighth insulating layer 476H may be formed on the resulting structure of FIG. 12D, and then a string selection line cut region SSLC4 may be formed by etching a portion of each of the eighth insulating layer 476H, the seventh insulating layer 476G, the second intermediate sacrificial layer MDB, the fourth insulating layer 476D, the first intermediate sacrificial layer MDA, and the third insulating layer 476C by using an etch mask (not illustrated) and the string selection line cut region SSLC4 may be filled with an isolation insulating layer 478. Each of the eighth insulating layer 476H and the isolation insulating layer 478 may include a silicon oxide layer.

By the string selection line cut region SSLC4, the first intermediate sacrificial layer MDA (see FIG. 12D) may be separated into a first intermediate sacrificial pattern MDA2 and a first bent sacrificial pattern RMDA, and the second intermediate sacrificial layer MDB (see FIG. 12D) may be separated into a second intermediate sacrificial pattern MDB2 and a second bent sacrificial pattern RMDB. The first bent sacrificial pattern RMDA may include a first vertical extension portion VA4, and the second bent sacrificial pattern RMDB may include a second vertical extension portion VB4.

Figure 12F:
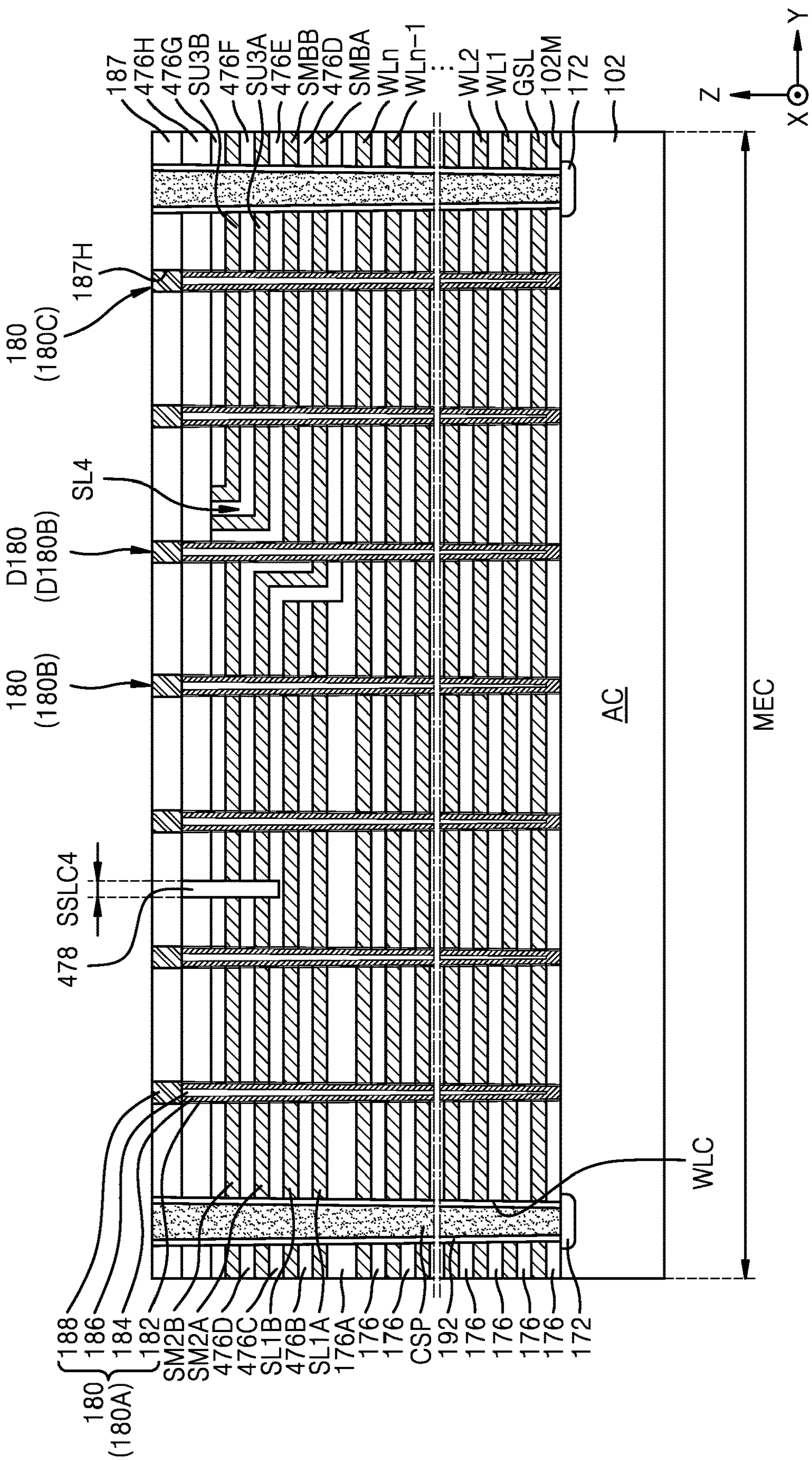

Referring to FIG. 12F, an upper insulating layer 187, a plurality of channel structures 180, and a plurality of dummy channel structures D180 may be formed on the resulting structure of FIG. 12E in the same way as described with reference to FIG. 9G. Thereafter, a plurality of word line cut regions WLC and a plurality of common source regions 172 may be formed in the same way as described with reference to FIG. 9H, and the plurality of sacrificial layers PW, the first and second lower sacrificial patterns LA1 and LB1, the first and second intermediate sacrificial patterns MDA2 and MDB2, the first and second upper sacrificial patterns UDA3 and UDB3, and the first and second bent sacrificial patterns RMDA and RMDB may be substituted with a ground selection line GSL, a plurality of word lines WL1, WL2, . . . , WLn−1, and WLn, and a string selection line structure SL4. The string selection line structure SL4 may include first and second lower string selection lines SL1A and SL1B, first and second intermediate string selection lines SM2A and SM2B, first and second upper string selection lines SU3A and SU3B, and first and second string selection bent lines SMBA and SMBB.

Figure 12G:
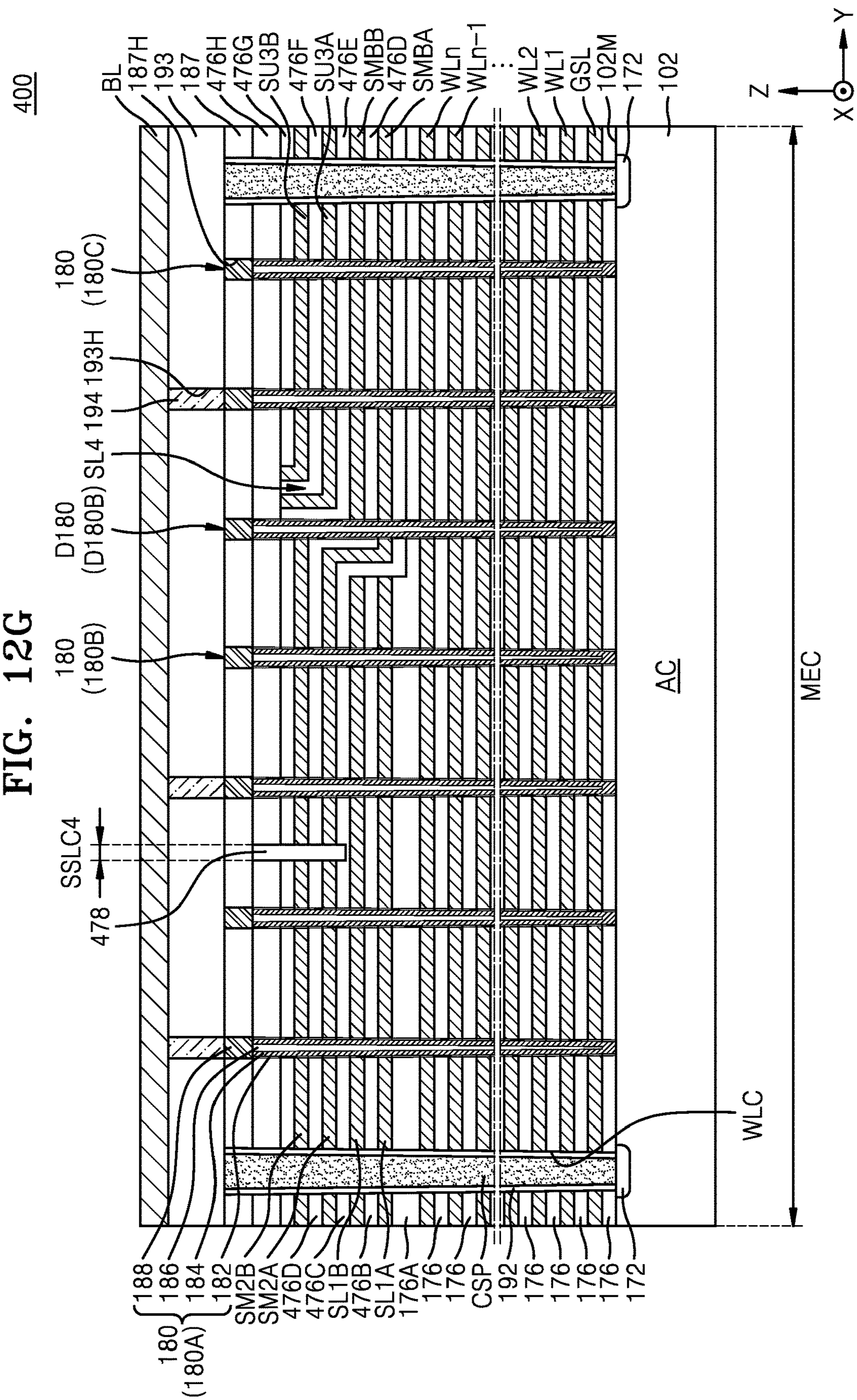

Referring to FIG. 12G, an insulating spacer 192 and a common source pattern CSP may be formed in each of the plurality of word line cut regions WLC in the same way as described with reference to FIG. 9I. Thereafter, an interlayer insulating layer 193, a plurality of contact plugs 194, and a plurality of bit lines BL may be formed in the same way as described with reference to FIG. 9J, to manufacture the integrated circuit device 400 illustrated in FIG. 6.

Although the example methods of manufacturing the integrated circuit devices 100, 200, 300, and 400 according to the inventive concept have been described above with reference to FIGS. 9A to 12G, those of ordinary skill in the art may well understand that various modifications and changes may be made therein within the scope of the inventive concept to manufacture the integrated circuit devices 500 and 600 illustrated in FIGS. 7 and 8 and integrated circuit devices variously modified therefrom within the scope of the inventive concept.

While the inventive concept has been particularly shown and described with reference to embodiments thereof, it will be understood that various changes in form and details may be made therein without departing from the spirit and scope of the following claims.

What is claimed is:

1. An integrated circuit device comprising:

a substrate;

a plurality of word line cut regions arranged over the substrate and extending in a first direction; and a plurality of unit block regions respectively arranged one by one between the plurality of word line cut regions and each comprising a string selection line structure and extending in a second direction perpendicular to the first direction, wherein, in each of the plurality of unit block regions, each string selection line structure comprises a string selection bent line comprising a lower horizontal extension portion extending in a horizontal direction at a first level over the substrate, an upper horizontal extension portion extending in the horizontal direction at a second level higher than the first level, and a vertical extension portion connected between the lower horizontal extension portion and the upper horizontal extension portion, wherein the plurality of unit block regions comprise a first unit block region and a second unit block region adjacent to each other with a first word line cut region selected among the plurality of word line cut regions therebetween, and wherein a first string selection line structure of the first unit block region and a second string selection line structure of the second unit block region have a mirror symmetry with respect to the first word line cut region.

2. The integrated circuit device of claim 1, wherein, in each of the plurality of unit block regions, each string selection line structure further comprises:

a lower string selection line extending in the horizontal direction at the first level and comprising a portion overlapping the upper horizontal extension portion of the string selection bent line in a vertical direction;

an intermediate string selection line extending in the horizontal direction at the second level and comprising a portion overlapping the lower string selection line in the vertical direction; and an upper string selection line extending in the horizontal direction at the second level and comprising a portion overlapping the lower horizontal extension portion of the string selection bent line in the vertical direction.

3. An integrated circuit device comprising:

a substrate;

a plurality of word line cut regions arranged over the substrate and extending in a first direction; and a plurality of unit block regions respectively arranged one by one between the plurality of word line cut regions and each comprising a string selection line structure and extending in a second direction perpendicular to the first direction, wherein the plurality of unit block regions comprise a first unit block region and a second unit block region adjacent to each other with a first word line cut region selected among the plurality of word line cut regions therebetween, and a first string selection line structure of the first unit block region and a second string selection line structure of the second unit block region have a mirror symmetry with respect to the first word line cut region.

4. The integrated circuit device of claim 3, wherein, in each of the plurality of unit block regions, the string selection line structure comprises a string selection bent line comprising a lower horizontal extension portion extending in a horizontal direction at a first level over the substrate, an upper horizontal extension portion extending in the horizontal direction at a second level higher than the first level, and a vertical extension portion connected between the lower horizontal extension portion and the upper horizontal extension portion.

5. The integrated circuit device of claim 3, wherein, in each of the plurality of unit block regions, the string selection line structure comprises:

a string selection bent line comprising a lower horizontal extension portion extending in a horizontal direction at a first level over the substrate and an upper horizontal extension portion extending in the horizontal direction at a second level higher than the first level; and a lower string selection line extending in the horizontal direction at the first level at a position spaced apart from the lower horizontal extension portion of the string selection bent line, the lower string selection line comprising a portion overlapping the upper horizontal extension portion of the string selection bent line in a vertical direction.

6. The integrated circuit device of claim 3, wherein, in each of the plurality of unit block regions, the string selection line structure comprises:

a string selection bent line comprising a lower horizontal extension portion extending in a horizontal direction at a first level over the substrate and an upper horizontal extension portion extending in the horizontal direction at a second level higher than the first level; and an intermediate string selection line extending in the horizontal direction at the second level at a position spaced apart from the upper horizontal extension portion of the string selection bent line.

7. The integrated circuit device of claim 3, wherein, in each of the plurality of unit block regions, the string selection line structure comprises:

a string selection bent line comprising a lower horizontal extension portion extending in a horizontal direction at a first level over the substrate and an upper horizontal extension portion extending in the horizontal direction at a second level higher than the first level; and an upper string selection line extending in the horizontal direction at the second level at a position spaced apart from the upper horizontal extension portion of the string selection bent line, the upper string selection line comprising a portion overlapping the lower horizontal extension portion of the string selection bent line in a vertical direction.

8. The integrated circuit device of claim 3, wherein, at least one of the plurality of unit block regions comprises first, second and third string selection regions sequentially arranged in a horizontal direction, and wherein, in the at least one of the plurality of unit block regions, the string selection line structure comprises:

a string selection bent line arranged only in the second and third string selection regions among the first, second and third string selection regions, the string selection bent line comprising a lower horizontal extension portion extending in the horizontal direction at a first level over the substrate, an upper horizontal extension portion extending in the horizontal direction at a second level higher than the first level, and a vertical extension portion connected between the lower horizontal extension portion and the upper horizontal extension portion; and a lower string selection line arranged only in the first and second string selection regions among the first, second and third string selection regions and extending in the horizontal direction at the first level, the lower string selection line overlapping the upper horizontal extension portion of the string selection bent line in a vertical direction in the second string selection region.

9. The integrated circuit device of claim 3, wherein, at least one of the plurality of unit block regions comprises first, second and third string selection regions sequentially arranged in a horizontal direction, and wherein, in the at least one of the plurality of unit block regions, the string selection line structure comprises:

a string selection bent line arranged only in the second and third string selection regions among the first, second and third string selection regions, the string selection bent line comprising a lower horizontal extension portion extending in the horizontal direction at a first level over the substrate, an upper horizontal extension portion extending in the horizontal direction at a second level higher than the first level, and a vertical extension portion connected between the lower horizontal extension portion and the upper horizontal extension portion; and an intermediate string selection line arranged only in the first string selection region among the first, second and third string selection regions and extending in the horizontal direction at the second level, the intermediate string selection line being spaced apart from the upper horizontal extension portion of the string selection bent line in the horizontal direction.

10. The integrated circuit device of claim 3, wherein, at least one of the plurality of unit block regions comprises first, second and third string selection regions sequentially arranged in a horizontal direction, and wherein, in the at least one of the plurality of unit block regions, the string selection line structure comprises:

a string selection bent line arranged only in the second and third string selection regions among the first, second and third string selection regions, the string selection bent line comprising a lower horizontal extension portion extending in the horizontal direction at a first level over the substrate, an upper horizontal extension portion extending in the horizontal direction at a second level higher than the first level, and a vertical extension portion connected between the lower horizontal extension portion and the upper horizontal extension portion;

a lower string selection line arranged only in the first and second string selection regions among the first, second and third string selection regions and extending in the horizontal direction at the first level, the lower string selection line overlapping the upper horizontal extension portion of the string selection bent line in a vertical direction in the second string selection region; and an intermediate string selection line arranged only in the first string selection region among the first, second and third string selection regions and extending in the horizontal direction at the second level, the intermediate string selection line overlapping the lower string selection line in the vertical direction.

11. The integrated circuit device of claim 3, wherein, at least one of the plurality of unit block regions comprises first, second and third string selection regions sequentially arranged in a horizontal direction, and wherein, in the at least one of the plurality of unit block regions, the string selection line structure comprises:

a string selection bent line arranged only in the second and third string selection regions among the first, second and third string selection regions, the string selection bent line comprising a lower horizontal extension portion extending in the horizontal direction at a first level over the substrate, an upper horizontal extension portion extending in the horizontal direction at a second level higher than the first level, and a vertical extension portion connected between the lower horizontal extension portion and the upper horizontal extension portion;

a lower string selection line arranged only in the first and second string selection regions among the first, second and third string selection regions and extending in the horizontal direction at the first level, the lower string selection line overlapping the upper horizontal extension portion of the string selection bent line in a vertical direction in the second string selection region;

an intermediate string selection line arranged only in the first string selection region among the first, second and third string selection regions and extending in the horizontal direction at the second level, the intermediate string selection line overlapping the lower string selection line in the vertical direction; and an upper string selection line arranged only in the third string selection region among the first, second and third string selection regions and extending in the horizontal direction, the upper string selection line being spaced apart from the intermediate string selection line in the horizontal direction with the upper horizontal extension portion of the string selection bent line therebetween.

12. The integrated circuit device of claim 3, wherein, at least one of the plurality of unit block regions comprises first, second and third string selection regions sequentially arranged in a horizontal direction, and wherein, in the at least one of the plurality of unit block regions, the string selection line structure comprises:

a string selection bent line arranged only in the second and third string selection regions among the first, second and third string selection regions, the string selection bent line comprising a lower horizontal extension portion extending in the horizontal direction at a first level over the substrate, an upper horizontal extension portion extending in the horizontal direction at a second level higher than the first level, and a vertical extension portion connected between the lower horizontal extension portion and the upper horizontal extension portion;

a lower string selection line arranged only in the first and second string selection regions among the first, second and third string selection regions and extending in the horizontal direction at the first level, the lower string selection line overlapping the upper horizontal extension portion of the string selection bent line in a vertical direction in the second string selection region;

an intermediate string selection line arranged only in the first string selection region among the first, second and third string selection regions and extending in the horizontal direction at the second level, the intermediate string selection line overlapping the lower string selection line in the vertical direction; and an upper string selection line arranged only in the third string selection region among the first, second and third string selection regions and extending in the horizontal direction, the upper string selection line overlapping the lower horizontal extension portion of the string selection bent line in the vertical direction.

13. The integrated circuit device of claim 3, wherein, at least one of the plurality of unit block regions comprises first, second and third string selection regions sequentially arranged in a horizontal direction, and wherein, in the at least one of the plurality of unit block regions, the string selection line structure comprises:

a string selection bent line arranged only in the second and third string selection regions among the first, second and third string selection regions, the string selection bent line comprising a lower horizontal extension portion extending in the horizontal direction at a first level over the substrate, an upper horizontal extension portion extending in the horizontal direction at a second level higher than the first level, and a vertical extension portion connected between the lower horizontal extension portion and the upper horizontal extension portion;

a lower string selection line arranged only in the first and second string selection regions among the first, second and third string selection regions and extending in the horizontal direction at the first level at a position spaced apart from the lower horizontal extension portion of the string selection bent line;

an intermediate string selection line arranged only in the first string selection region among the first, second and third string selection regions and extending in the horizontal direction at the second level at a position spaced apart from the upper horizontal extension portion of the string selection bent line; and an upper string selection line arranged only in the third string selection region among the first, second and third string selection regions and extending in the horizontal direction at the second level at a position spaced apart from the upper horizontal extension portion of the string selection bent line, wherein a minimum spacing distance between the lower string selection line and the upper string selection line in a second horizontal direction is greater than a minimum spacing distance between the lower string selection line and the lower horizontal extension portion of the string selection bent line.

14. An integrated circuit device comprising:

a substrate;

a word line cut region arranged over the substrate and extending in a first direction; and a first unit block region and a second unit block region adjacent to each other with the word line cut region therebetween, each of the first unit block region and the second unit block region extending in a second direction perpendicular to the first direction, wherein the first unit block region comprises a first string selection line structure and the second unit block region comprises a second string selection line structure, wherein each of the first string selection line structure and the second string selection line structure comprises at least one string selection bent line comprising a lower horizontal extension portion extending in a horizontal direction at a first level over the substrate, an upper horizontal extension portion extending in the horizontal direction at a second level higher than the first level, and a vertical extension portion connected between the lower horizontal extension portion and the upper horizontal extension portion, and wherein the first string selection line structure and the second string selection line structure have a mirror symmetry structure with respect to the word line cut region.

15. The integrated circuit device of claim 14, wherein, in each of the first string selection line structure and the second string selection line structure, the at least one string selection bent line comprises a plurality of string selection bent lines.

16. The integrated circuit device of claim 14, wherein each of the first string selection line structure and the second string selection line structure further comprises:

at least one lower string selection line extending in the horizontal direction at the first level and comprising a portion overlapping the upper horizontal extension portion in a vertical direction;

at least one of intermediate string selection line extending in the horizontal direction at the second level and comprising a portion overlapping the at least one lower string selection line in the vertical direction; and at least one of upper string selection line extending in the horizontal direction at the second level and comprising a portion overlapping the lower horizontal extension portion in the vertical direction.

17. The integrated circuit device of claim 14, wherein each of the first unit block region and the second unit block region comprises first, second and third string selection regions sequentially arranged in the horizontal direction, wherein each of the first string selection line structure and the second string selection line structure further comprises at least one lower string selection line arranged only in the first and second string selection regions among the first, second and third string selection regions and extending in the horizontal direction at the first level at a position spaced apart from the at least one string selection bent line, and wherein, the at least one string selection bent line is arranged only in the second and third string selection regions among the first, second and third string selection regions.

18. The integrated circuit device of claim 14, wherein each of the first unit block region and the second unit block region comprises first, second and third string selection regions sequentially arranged in the horizontal direction, wherein each of the first string selection line structure and the second string selection line structure further comprises:

at least one lower string selection line arranged only in the first and second string selection regions among the first, second and third string selection regions and extending in the horizontal direction at the first level at a position spaced apart from the at least one string selection bent line; and at least one of upper string selection line arranged only in the third string selection region among the first, second and third string selection regions and extending in the horizontal direction at the second level at a position spaced apart from the at least one string selection bent line, and wherein, the at least one string selection bent line is arranged only in the second and third string selection regions among the first, second and third string selection regions.

* * * * *